US008025086B2

(12) United States Patent
Aoyama et al.

(10) Patent No.: US 8,025,086 B2
(45) Date of Patent: Sep. 27, 2011

(54) ELECTRONIC COMPONENT MANUFACTURING APPARATUS

(75) Inventors: Hiroshi Aoyama, Akashi (JP); Ryoichi Nishigawa, Akashi (JP)

(73) Assignee: Hallys Corporation, Akashi-shi (JP)

( * ) Notice: Subject to any disclaimer, the term of this patent is extended or adjusted under 35 U.S.C. 154(b) by 907 days.

(21) Appl. No.: 11/909,674

(22) PCT Filed: Apr. 6, 2006

(86) PCT No.: PCT/JP2006/307342
§ 371 (c)(1),
(2), (4) Date: Oct. 2, 2007

(87) PCT Pub. No.: WO2006/109678
PCT Pub. Date: Oct. 19, 2006

(65) Prior Publication Data
US 2009/0158564 A1    Jun. 25, 2009

(30) Foreign Application Priority Data

Apr. 6, 2005    (JP) .................................. 2005-109487

(51) Int. Cl.
*B29C 65/00*    (2006.01)
*B32B 38/18*    (2006.01)
*B65H 29/00*    (2006.01)
*H01L 21/00*    (2006.01)
(52) U.S. Cl. ........ 156/517; 156/250; 156/252; 156/256; 156/510; 156/516; 156/538; 156/539; 156/556; 156/566; 156/567; 438/464
(58) Field of Classification Search .................. 29/25.01; 156/250, 252, 256, 510, 516, 517, 538, 539, 156/556, 566, 567; 198/339.1, 373, 418.7, 198/419.2; 228/47.1, 49.1; 438/113, 114, 438/458, 464
See application file for complete search history.

(56) References Cited

U.S. PATENT DOCUMENTS

| 4,558,397 | A | 12/1985 | Olsson |
| 4,619,043 | A | 10/1986 | Takahashi et al. |
| 4,656,478 | A | 4/1987 | Leuenberger |
| 4,746,618 | A | 5/1988 | Nath et al. |
| 4,915,565 | A | 4/1990 | Bond et al. |
| 5,078,375 | A | 1/1992 | Steidinger |

(Continued)

FOREIGN PATENT DOCUMENTS

DE    19634473 A1    1/1998

(Continued)

OTHER PUBLICATIONS

Supplementary European Search Report dated Oct. 1, 2009, issued in corresponding European Patent Application No. 06731290.

*Primary Examiner* — Mark A Osele
*Assistant Examiner* — Christopher C Caillouet
(74) *Attorney, Agent, or Firm* — Westerman, Hattori, Daniels & Adrian, LLP

(57) ABSTRACT

To provide a manufacturing apparatus of an electronic component using an interposer, having high installation flexibility and high production efficiency. The electronic component manufacturing apparatus includes a converter unit configured to place an interposer on a surface of a base circuit sheet, and an interposer supply unit configured to continuously convey carriers holding the interposers and supply the interposers to the converter unit. The interposer supply unit has the carriers that hold the interposers, and is configured to convey the interposers via the carriers.

10 Claims, 21 Drawing Sheets

U.S. PATENT DOCUMENTS

| | | | |
|---|---|---|---|
| 5,235,736 | A | 8/1993 | Hahs, Jr. et al. |
| 5,615,476 | A | 4/1997 | Bottge et al. |
| 5,690,773 | A | 11/1997 | Fidalgo et al. |
| 5,751,256 | A | 5/1998 | McDonough et al. |
| 5,825,291 | A | 10/1998 | Platt et al. |
| 5,826,328 | A | 10/1998 | Brady et al. |
| 5,946,791 | A | 9/1999 | Baldwin |
| 5,966,903 | A | 10/1999 | Dudderar et al. |
| 5,972,156 | A | 10/1999 | Brady et al. |
| 5,973,600 | A | 10/1999 | Mosher, Jr. |
| 6,018,299 | A | 1/2000 | Eberhardt |
| 6,078,259 | A | 6/2000 | Brady et al. |
| 6,100,804 | A | 8/2000 | Brady et al. |
| 6,140,146 | A | 10/2000 | Brady et al. |
| 6,215,401 | B1 | 4/2001 | Brady et al. |
| 6,219,911 | B1 | 4/2001 | Estes et al. |
| 6,259,408 | B1 | 7/2001 | Brady et al. |
| 6,369,711 | B1 | 4/2002 | Adams et al. |
| 6,394,346 | B1 | 5/2002 | Bonneau, Jr. et al. |
| 6,410,415 | B1 | 6/2002 | Estes et al. |
| 6,445,977 | B1 | 9/2002 | Hwang et al. |
| 6,456,228 | B1 | 9/2002 | Granhed et al. |
| 6,479,777 | B2 | 11/2002 | Yamakawa |
| 6,492,717 | B1 | 12/2002 | Gore et al. |
| 6,523,734 | B1 | 2/2003 | Kawai et al. |
| 6,525,410 | B1 | 2/2003 | Gelsomini et al. |
| 6,570,490 | B1 | 5/2003 | Saitoh et al. |
| 6,667,192 | B1 | 12/2003 | Patrice et al. |
| 6,745,945 | B1 | 6/2004 | Limelette et al. |
| 6,779,733 | B2 | 8/2004 | Akita et al. |
| 6,891,110 | B1 | 5/2005 | Pennaz et al. |
| 6,957,481 | B1 | 10/2005 | Patrice |
| 6,972,394 | B2 | 12/2005 | Brod et al. |
| 7,014,729 | B2 | 3/2006 | Grabau et al. |
| 7,578,053 | B2 | 8/2009 | Nishigawa et al. |
| 2001/0012682 | A1 | 8/2001 | Kayanakis et al. |
| 2003/0070289 | A1 | 4/2003 | Hwang et al. |
| 2003/0136503 | A1 | 7/2003 | Green et al. |
| 2004/0088855 | A1 | 5/2004 | Akram |
| 2004/0125040 | A1 | 7/2004 | Ferguson et al. |
| 2004/0168310 | A1 | 9/2004 | Takano et al. |
| 2004/0192011 | A1 | 9/2004 | Roesner |
| 2004/0194876 | A1 | 10/2004 | Overmeyer et al. |
| 2005/0001785 | A1 | 1/2005 | Ferguson et al. |
| 2005/0035924 | A1 | 2/2005 | Liu et al. |
| 2005/0155219 | A1 | 7/2005 | Hwang |
| 2005/0224186 | A1* | 10/2005 | Sillner ............ 156/584 |
| 2005/0252605 | A1 | 11/2005 | Green et al. |
| 2006/0029948 | A1* | 2/2006 | Lim et al. ............ 435/6 |
| 2009/0217515 | A1 | 9/2009 | Aoyama et al. |

FOREIGN PATENT DOCUMENTS

| | | | |
|---|---|---|---|
| DE | 19805031 | A1 | 8/1999 |
| DE | 19840226 | A1 | 3/2000 |
| DE | 10120269 | C1 | 7/2002 |
| EP | 0534454 | A1 | 3/1993 |
| EP | 0749270 | A1 | 12/1996 |
| EP | 0902475 | A2 | 3/1999 |
| EP | 1352835 | A2 | 10/2003 |
| EP | 1833290 | A1 | 9/2007 |
| EP | 1835796 | A1 | 9/2007 |
| FR | 2775533 | A1 | 9/1999 |
| GB | 2140716 | | 12/1984 |
| JP | 1-308097 | A | 12/1989 |
| JP | 2-98902 | A | 4/1990 |
| JP | 9-240176 | A | 9/1997 |
| JP | 10-50736 | A | 2/1998 |
| JP | 10-163252 | A | 6/1998 |
| JP | 11-282997 | A | 10/1999 |
| JP | 2000-227950 | A | 8/2000 |
| JP | 2000-244199 | A | 9/2000 |
| JP | 2001-135992 | A | 5/2001 |
| JP | 2002-007989 | A | 1/2002 |
| JP | 2002-298108 | A | 10/2002 |
| JP | 2003-168099 | A | 6/2003 |
| JP | 2003-281491 | A | 10/2003 |
| JP | 2003-281936 | A | 10/2003 |
| JP | 2003-283120 | A | 10/2003 |
| JP | 2003-283121 | A | 10/2003 |
| JP | 2003-288570 | A | 10/2003 |
| JP | 2004-038573 | A | 2/2004 |
| JP | 2004-179611 | A | 6/2004 |
| JP | 2004-180217 | A | 6/2004 |
| JP | 2004-220304 | A | 8/2004 |
| JP | 2004-265920 | A | 9/2004 |
| JP | 2004-265953 | A | 9/2004 |
| JP | 2005-044268 | A | 2/2005 |
| JP | 2005-286171 | A | 10/2005 |
| WO | 95/21423 | A1 | 8/1995 |
| WO | 99/35691 | A1 | 7/1999 |
| WO | 00/16285 | A1 | 3/2000 |
| WO | 00/64229 | A1 | 10/2000 |
| WO | 01/54058 | A1 | 7/2001 |
| WO | 01/61646 | A1 | 8/2001 |
| WO | 01/95241 | A1 | 12/2001 |
| WO | 02/37414 | A1 | 5/2002 |
| WO | 02/49093 | A1 | 6/2002 |
| WO | 02/082368 | A1 | 10/2002 |
| WO | 02/093625 | A1 | 11/2002 |
| WO | 03/007232 | A1 | 1/2003 |
| WO | 03/012734 | A1 | 2/2003 |
| WO | 03/022023 | A1 | 3/2003 |
| WO | 03/071476 | A1 | 8/2003 |
| WO | 03/107266 | A1 | 12/2003 |
| WO | 2004/012896 | A1 | 2/2004 |
| WO | 2004/046762 | A1 | 6/2004 |
| WO | 2004/088571 | A2 | 10/2004 |
| WO | 2005/096435 | A1 | 10/2005 |
| WO | 2006/009934 | A1 | 1/2006 |

* cited by examiner

ELECTRONIC COMPONENT MANUFACTURING APPARATUS

CROSS-REFERENCES TO RELATED APPLICATIONS

This is a US national stage of International Patent Application PCT/JP2006/307342, filed with the Japan Receiving Office on Apr. 6, 2006, claiming the benefit of priority of Japanese Patent Application 2005-109487, filed with the Japan Patent Office on Apr. 6, 2005.

TECHNICAL FIELD

The present invention relates to a manufacturing apparatus for manufacturing an electronic component in which an interposer having a semiconductor chip mounted thereon is bonded to a base circuit sheet.

BACKGROUND ART

There has been known an electronic component in which, for example, an interposer having a semiconductor chip mounted on a resin film is bonded to a surface of a sheet-like base circuit sheet made of resin film. Such an electronic component includes, for example, an RFID medium in which an interposer having an IC chip mounted thereon is bonded to a base circuit sheet having an antenna pattern. A manufacturing apparatus for manufacturing the RFID medium includes, for example, an apparatus that cuts individual pieces of interposers from a continuous sheet having semiconductor chips continuously mounted thereon, and successively bonds the cut interposers to a base circuit sheet (for example, refer to Patent Document 1).

However, the conventional electronic component manufacturing apparatus has the following problems. Specifically, a cutting unit for cutting the individual pieces of interposers and a converter unit for transferring the interposers to an antenna sheet need to be placed adjacent to each other, and therefore, design flexibility of the manufacturing apparatus may not be sufficiently increased. Thus, the manufacturing apparatus has less flexibility in layout of the apparatus, and is sometimes difficult to apply to a manufacturing site. Further, in the manufacturing apparatus, a cutting step of the interposers may need to be performed in synchronization with a bonding step of the interposers. This may prevent sufficient increase in production efficiency of the electronic component.

Patent Document 1: Japanese Patent Laid-Open No. 2003-281491

The present invention is achieved in view of the conventional problems, and has an object to provide a manufacturing apparatus of an electronic component using an interposer, having high installation flexibility and high production efficiency.

DISCLOSURE OF THE INVENTION

The present invention provides an electronic component manufacturing apparatus for manufacturing an electronic component in which an interposer having a semiconductor chip mounted on a sheet-like chip holding member and having an interposer terminal that is a connection terminal extended from the semiconductor chip is bonded to a base circuit sheet made of a sheet-like base member and having a base terminal on a surface, the apparatus comprising:

a converter unit having a substantially cylindrical anvil roller configured to rotate while continuously holding the base circuit sheet on an outer peripheral surface thereof, and end-effectors configured to hold the interposer and configured to revolve the interposer along a circular path substantially circumscribing the outer peripheral surface of the anvil roller, the converter unit being configured to place the interposer on the surface of the base circuit sheet so that the base terminal and the interposer terminal face each other; and an interposer supply unit configured to continuously supply interposers to the converter unit, wherein the interposer supply unit has carriers that hold the interposers and is configured to convey the interposers via the carriers.

In the electronic component manufacturing apparatus according to the present invention, the interposer supply unit supplies the interposer held by the carrier to the converter unit configured to place the interposer on the surface of the base circuit sheet. Specifically, in the electronic component manufacturing apparatus, the interposer previously cut and held by the carrier can be supplied to the converter unit. Thus, in the manufacturing apparatus, there is little possibility of trouble in the interposer during the supply of the interposer to the converter unit.

Thus, according to the electronic component manufacturing apparatus, for example, there is no need for laying out an interposer cutting unit for cutting individual pieces of interposers close to the converter unit, thereby increasing installation flexibility. In the manufacturing apparatus, the interposer supply unit conveys the interposer held by the carrier with high reliability. Thus, the interposer supply unit is provided to allow the converter unit and a unit for performing an upstream operation such as the interposer cutting unit to be installed with high flexibility while preventing the possibility of trouble in the interposer. Further, for example, the electronic component manufacturing apparatus may be installed separately from the interposer cutting unit. In this case, the interposer may be supplied with the electronic component held by the carrier to produce the electronic component.

Further, in the electronic component manufacturing apparatus of the present invention, the previously cut interposers held by the carriers may be continuously supplied to the converter unit. Thus, the electronic component manufacturing apparatus can make the converter unit reach its full potential, and produce the electronic component with extremely high efficiency.

As described above, the electronic component manufacturing apparatus of the present invention has high installation flexibility and high production efficiency.

Figure 1:
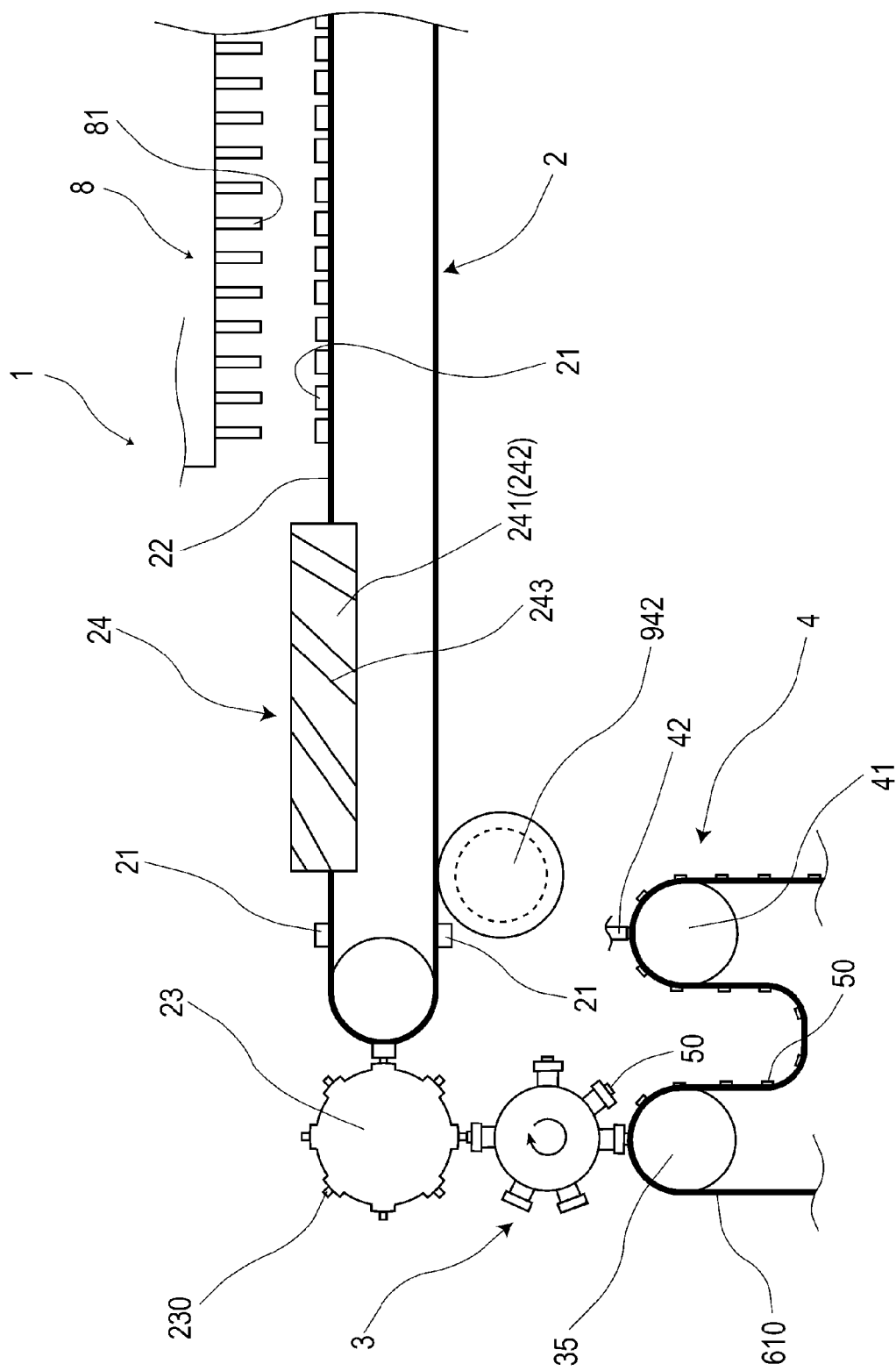
FIG. 1 is a side view of a configuration of an electronic component manufacturing apparatus in Embodiment 1.

DESCRIPTION OF SYMBOLS 1 electronic component manufacturing apparatus
2 interposer supply unit
21 carrier
3 converter unit
35 anvil roller
371 to 376 end-effector
4 press unit
5 RFID medium (electronic component)
50 interposer
51 IC chip (semiconductor chip)
53 chip holding member
530 large chip holding member
60 base circuit sheet
61 base member
610 continuous base member
7 interposer cutting unit
8 transporter unit
9 carrier placing unit

BEST MODE FOR CARRYING OUT THE INVENTION

In the present invention, the chip holding member and the base member may be made of synthetic resin such as PET film, PPS resin, PLA resin, or general-purpose engineering plastics, paper, nonwoven fabric, metal material such as aluminum foil or copper foil, or glass. A combination of the chip holding member and the base member may be either of the same materials or of different materials. The carrier is preferably made of polyimide engineering plastics, polyacetal, or nylon 66.

The interposer supply unit preferably includes a conveyer belt for receiving and conveying the carriers, and an interval adjusting mechanism configured to adjust a conveying interval between adjacent carriers.

In this case, the interval adjusting mechanism can adjust a conveying interval between the interposers in the interposer supply unit. This allows adjustment of synchronization between the interposer supply unit and the converter unit, and further smoothens transfer of the interposer therebetween.

The electronic component manufacturing apparatus preferably includes a carrier placing unit configured to collect and place the empty carriers after the transfer of the interposer to the end-effector, and a transporter unit configured to transfer the interposer to each carrier placed by the carrier placing unit.

In this case, the transporter unit transfers the interposer to the carrier placed by the carrier placing unit. Thus, the electronic component can be produced continuously including a step of the interposer being held by the carrier.

It is preferable that the carrier placing unit is configured to place the carriers with gaps therebetween, and the transporter unit has an engaging portion configured to engage the carriers so as to adjust the positions of the carriers, and simultaneously transfer the interposers to the carriers.

In this case, the engaging portion engages the carriers to adjust the positions of the carriers. Thus, the transporter unit can transfer the interposers with high positional accuracy. The carriers are placed with the gaps therebetween to reduce the possibility of interference of the carriers with each other.

The electronic component manufacturing apparatus includes an interposer cutting unit that cuts individual interposers so that two-dimensional arrangement of the semiconductor chips are maintained, from a large chip holding member having the semiconductor chips mounted two-dimensionally thereon so as to form two or more rows and two or more columns, and the transporter unit is preferably configured to transfer to the carriers two or more interposers arranged substantially in line along the rows or the columns among the interposers cut by the interposer cutting unit.

In this case, the electronic component manufacturing apparatus can produce the electronic component with extremely high efficiency from the large chip holding member having the semiconductor chips mounted two-dimensionally thereon. Particularly, the transporter unit preferably includes, for example, a plurality of holding arms for holding and transferring the interposer correspondingly to each interposer arranged substantially in line. In this case, the plurality of interposers can be simultaneously transferred to the carriers.

Also, the electronic component manufacturing apparatus preferably includes an interposer selecting mechanism that detects defective interposers, and selectively supplies only good interposers to the converter unit.

In this case, the good interposers only are supplied to the converter unit, thereby increasing yield of the electronic component. Thus, the electronic component manufacturing apparatus increases production efficiency of the electronic component and reduces product costs.

Further, it is preferable that the semiconductor chip is an IC chip for an RFID medium, and the base circuit sheet has an antenna pattern electrically connected to the IC chip.

RFID is an abbreviation of Radio-Frequency Identification. When an RFID medium is fabricated by an electronic component manufacturing method of the present invention, a product with high reliability and high quality can be produced with extremely high efficiency. Particularly, the cost of the RFID medium is required to be reduced, and thus the operation and effect of the present invention with high production efficiency is effective. The electronic component manufacturing apparatus can fabricate an RFID medium for contact ID besides an RFID medium for noncontact ID.

Embodiment 1

Figure 2:
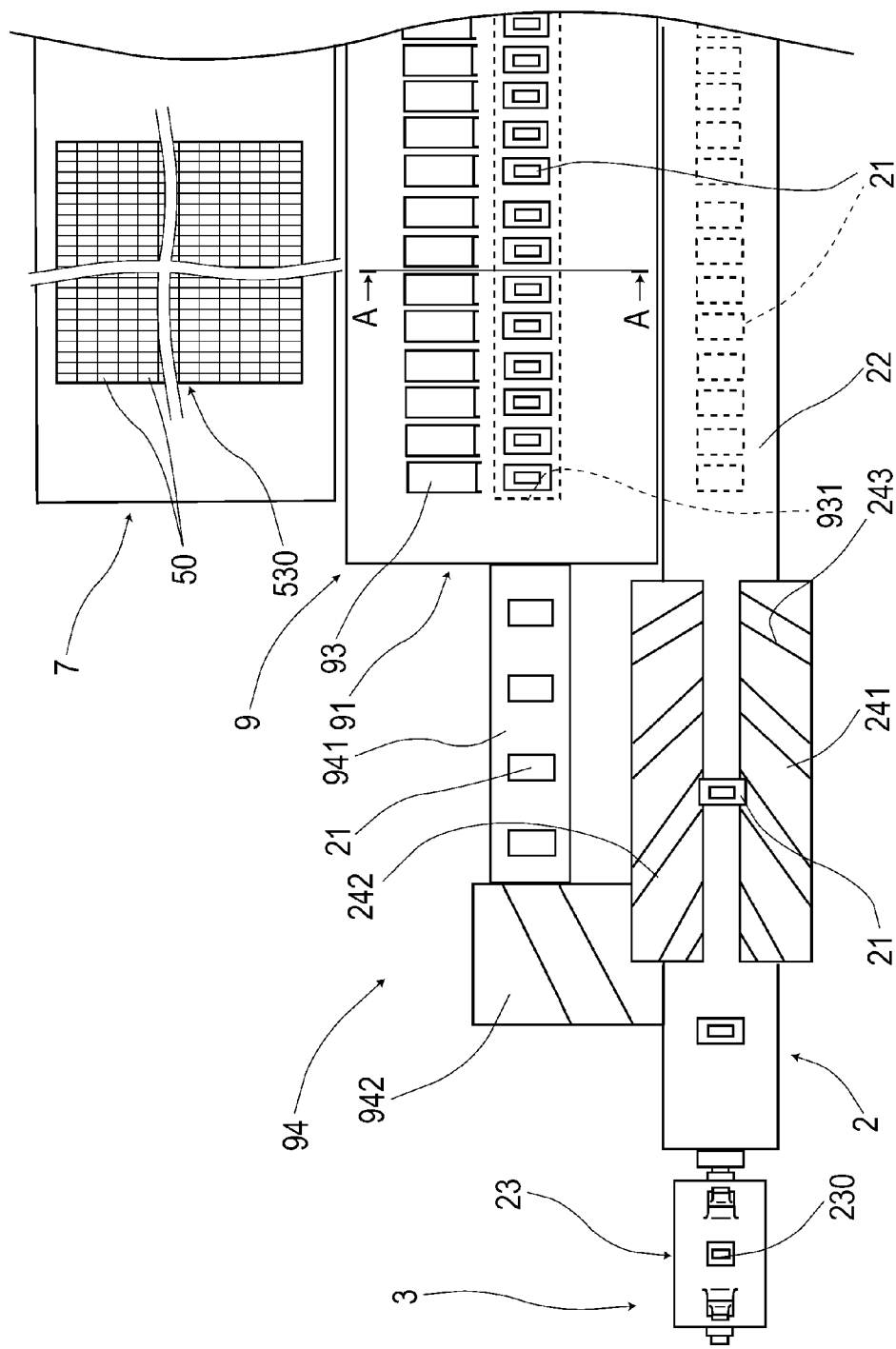
FIG. 2 is a top view of the configuration of the electronic component manufacturing apparatus in Embodiment 1.
Figure 3:
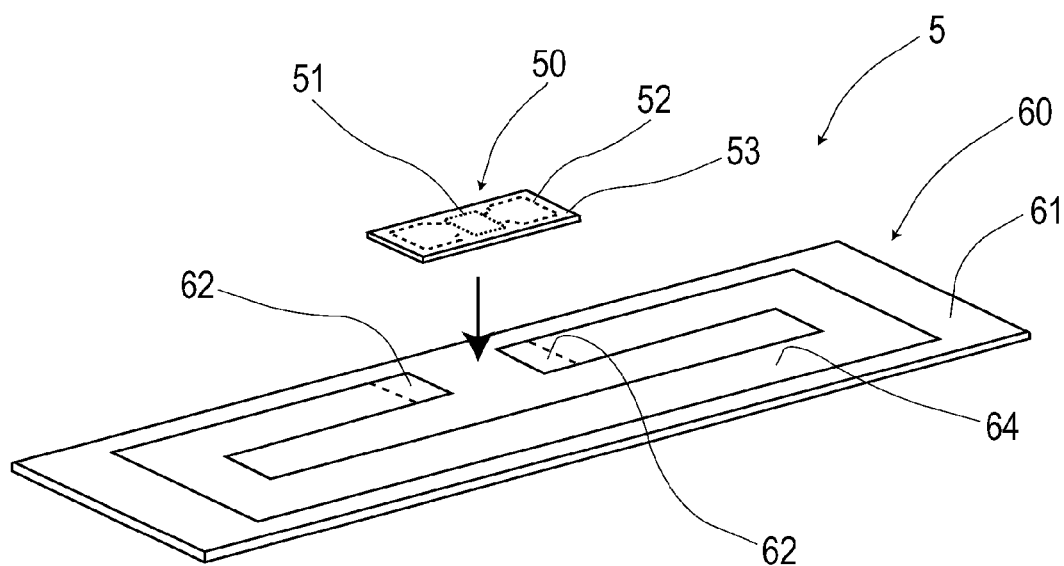
FIG. 3 is a perspective view of an RFID medium that is an electronic component in Embodiment 1.

This embodiment relates to a manufacturing apparatus for manufacturing an electronic component 5 using an interposer 50 of in the form of a sheet piece having a semiconductor chip 51 mounted thereon. This will be described with reference to FIGS. 1 to 24. As shown in FIGS. 1 to 3, the electronic component manufacturing apparatus 1 in this embodiment is an apparatus for manufacturing an electronic component 5 in which the interposer 50 having a semiconductor chip 51 mounted on a sheet-like chip holding member 53 and having an interposer terminal 52 that is a connection terminal extended from the semiconductor chip 51 is bonded to a base circuit sheet 60 made of a sheet-like base member 61 and having a base terminal 62 on a surface thereof.

As shown in FIGS. 1 and 2, the electronic component manufacturing apparatus 1 includes a converter unit 3 configured to place the interposer 50 on the surface of the base circuit sheet 60, and an interposer supply unit 2 configured to continuously convey carriers 21 holding the interposers 50 so as to supply the interposers 50 to the converter unit 3.

As shown in FIGS. 1 and 2, the converter unit 3 in the embodiment has a substantially cylindrical anvil roller 35 configured to rotate while continuously holding the base circuit sheet 60 on an outer peripheral surface thereof, and end-effectors 371 to 376 holding the interposers 50 and configured to revolve the interposers 50 along a circular path substantially circumscribing the outer peripheral surface of the anvil roller 35, and the converter unit 3 is configured to place the interposers 50 on the surface of the base circuit sheet 60 so that the base terminal 62 and the interposer terminal 52 face each other.

The interposer supply unit 2 has the carriers 21 that hold the interposers 50, and is configured to convey the interposers 50 via the carriers 21.

Now, this will be described in more detail.

First, the electronic component 5 fabricated in the embodiment will be described. As shown in FIG. 3, the electronic component 5 is an RFID (Radio-Frequency Identification) medium for noncontact ID (hereinafter, referred to as RFID medium 5 as appropriate). The RFID medium 5 is constituted by an interposer 50 having an RFID IC chip (hereinafter referred to as IC chip 51 as appropriate) as a semiconductor chip 51 mounted thereon, placed and bonded on a base circuit sheet 60 having an antenna pattern 64 including the base terminal 62.

As shown in FIG. 3, the interposer 50 has the IC chip 51 mounted on a surface of a sheet-like chip holding member 53 of PSF having a thickness of 200 μm. A conductive pad (not shown in figures) electrically connected to an electrode pad (not shown in figures) of the IC chip 51, and the interposer terminal 52 extended from the conductive pad are provided on the surface of the chip holding member 53. In the embodiment, the conductive pad and the interposer terminal 52 are formed of conductive ink.

The chip holding member 53 may be made of PC (Poly Carbonate) or processed paper instead of PSF in the embodiment. Underfill material or potting material may be used for protecting an electrical connecting portion between the conductive pad and the electrode pad. The interposer terminal 52 or the like may be formed by copper etching, dispensing, metal foil affixation, direct vapor deposition of metal, metal vapor deposition film transfer, or formation of conductive polymer layer, instead of a method of printing the conductive ink in the embodiment.

As shown in FIG. 3, the base circuit sheet 60 has the antenna pattern 64 of conductive ink provided on a surface of a thermoplastic base member 61 of PET having a thickness of 100 μm. The antenna pattern 64 has a substantially annular shape with a cut in one point. Both ends of the one point in the antenna pattern 64 have base terminals 62 that electrically connect to the interposer terminals 52.

Like the interposer terminal 52 formed on the chip holding member 53, an antenna pattern 64 formed by copper etching, dispensing, metal foil affixation, direct vapor deposition of metal, metal vapor deposition film transfer, or formation of conductive polymer layer may be provided instead of the antenna pattern 64 of the conductive ink. The base member 61 may be made of PET-G, PC, PP, nylon, or paper besides PET in the embodiment. The conductive ink may be made of silver, graphite, silver chloride, copper, or nickel.

Next, the electronic component manufacturing apparatus 1 for manufacturing the RFID medium 5 will be described. As shown in FIGS. 1 and 2, the electronic component manufacturing apparatus 1 includes, besides the converter unit 3 and the interposer supply unit 2, an interposer cutting unit 7 that cuts the interposers 50 from a large chip holding member 530 on which the IC chips 51 are two-dimensionally arranged, a carrier placing unit 9 that collects and places empty carriers 21 after the transfer of the interposers 50, a transporter unit 8 that receives the interposers 50 from the interposer cutting unit 7 and transfers the interposers 50 to the carriers 21, and a press unit 4 configured to press and bond the interposers 50 to the base circuit sheet 60.

Figure 4:
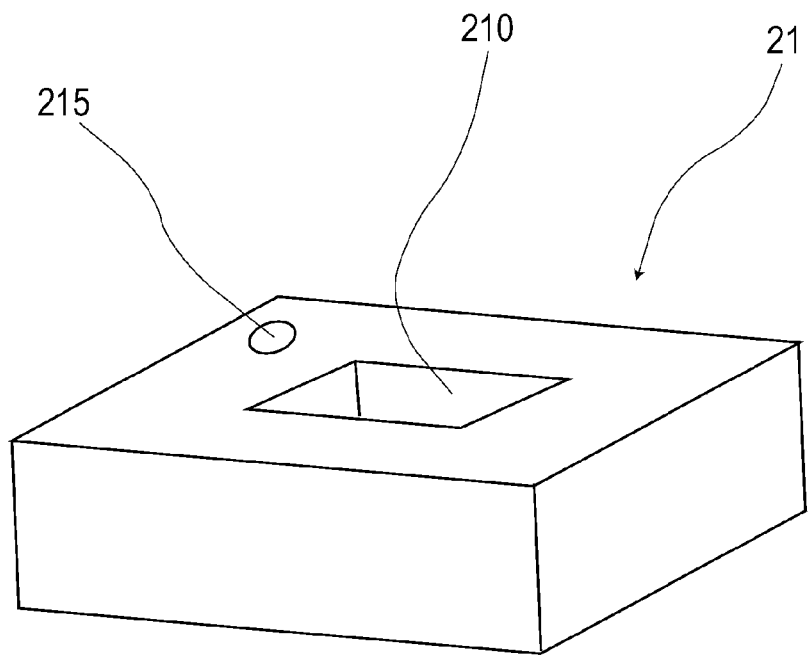
FIG. 4 is a perspective view of a carrier in Embodiment 1.
Figure 5:
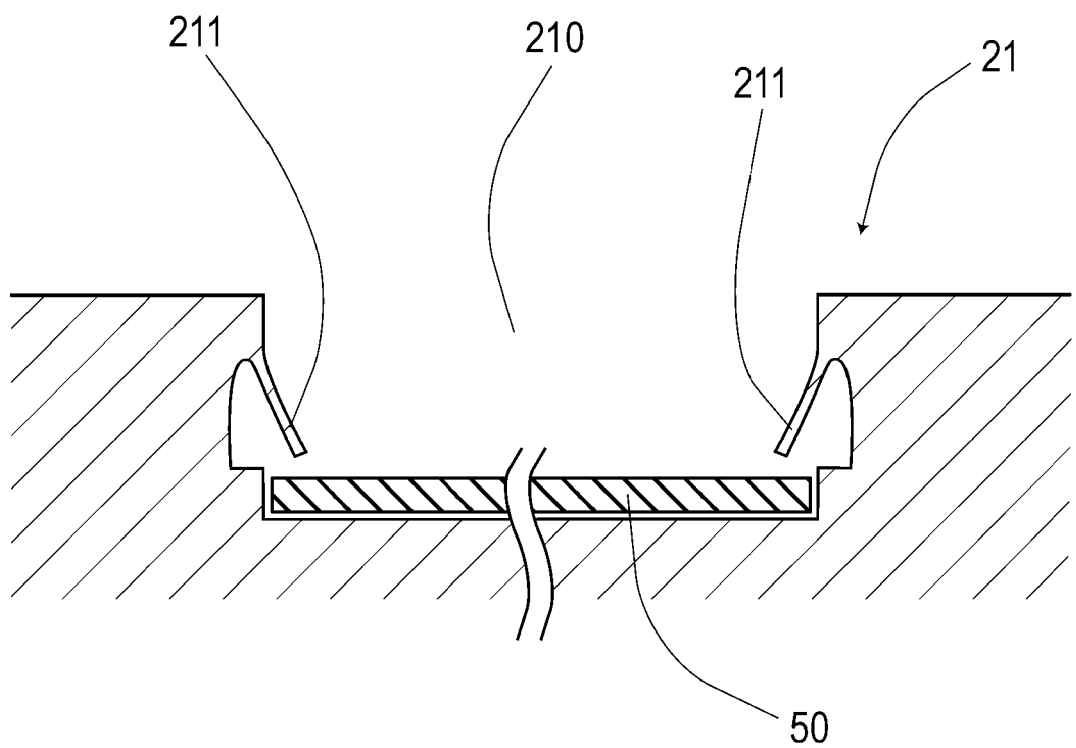
FIG. 5 is a sectional view of a sectional structure of the carrier in Embodiment 1.

First, the carrier 21 used in the embodiment will be described. The carrier 21 is a substantially rectangular member of ultra-high molecular weight polyethylene as shown in FIGS. 4 and 5. A recess 210 having a substantially rectangular cross-section for housing the interposer 50 is formed in a top surface of the carrier 21. Locking mechanisms for locking the housed interposer 50 are provided on two facing surfaces in a longitudinal direction among inner peripheral wall surfaces that form the recess 210. The locking mechanisms are formed by latching portions 211 that are resiliently moved toward and apart from the inner periphery of the recess 210. The latching portions 211 form inclined surfaces divergent toward an opening of the recess 210 so that portions protruding from the inner peripheral wall surfaces move in the protruding direction.

As shown in FIG. 4, the carrier 21 in the embodiment has a circular hole 215 perforated thereon, adjacent to the recess 210 in the surface having the recess 210. The circular hole 215 is configured to engage a pin-like engaging portion 815 (FIG. 20) provided at a tip of a vacuum arm 81 of the transporter unit 8. When the engaging portion 815 is inserted into the circular hole 215, a relative positional relationship between the recess 210 of the carrier 21 and the vacuum arm 81 is adjusted with high accuracy.

As shown in FIGS. 1 and 2, the interposer supply unit 2 includes a conveyer belt 22 that conveys the carriers 21 holding the interposers 50, an interval adjusting mechanism 24 for adjusting conveying intervals between the carriers 21, and a holding pulley 23 that takes out the interposers 50 conveyed by the conveyer belt 22 from the carriers 21 and receives the interposers 50.

The interval adjusting mechanism 24 in the embodiment includes a pair of substantially cylindrical carrier feed spirals 241 and 242 elongated in the longitudinal direction, and the carrier feed spirals 241 and 242 are provided near an end of the conveyer belt 22 on the side of the converter unit 3. As shown in FIGS. 1 and 2, the pair of carrier feed spirals 241 and 242 are provided substantially in parallel with a conveying direction of the conveyer belt 22 and face each other with the carriers 21 on the conveyer belt 22 in between. Each of the carrier feed spirals 241 and 242 has a spiral groove 243 that engages ends of the carriers 21 in an outer peripheral surface thereof.

The first carrier feed spiral 241 placed on the left of the conveyer belt 22 in a downstream direction has a counterclockwise spiral groove 243 in the downstream direction, and is configured to rotate clockwise in the downstream direction. On the other hand, the second carrier feed spiral 242 placed on the right in the downstream direction has a clockwise spiral groove 243 in the downstream direction, and is configured to rotate counterclockwise in the downstream direction.

The spiral groove 243 of each of the carrier feed spirals 241 and 242 is formed so as to have forming pitches gradually increasing along an axis thereof as shown in the figure. Thus, the interposer supply unit 2 is configured to increase the conveying intervals between the carriers 21 conveyed along the spiral groove 243, and achieve synchronization with rotation of the holding pulley 23 corresponding to a receiving cycle of the interposers 50 by the converter unit 3.

As shown in FIGS. 1 and 2, the holding pulley 23 is a substantially disk-shaped rotation member, and has radially protruding holding rods 230 on an outer peripheral surface in a thickness direction. The plurality of holding rods 230 are provided substantially at regular intervals in a circumferential direction. The holding rod 230 can be housed in the recess 210 of the carrier 21, and is configured to release the locking mechanism of the carrier 21 when housed in the recess 210. Specifically, the holding rod 230 is inserted into the recess 210 to retract the latching portions 211. A holding surface that is a tip surface of the holding rod 230 has an unshown pressure introducing hole. The holding rod 230 forms negative pressure in the pressure introducing hole to suck and hold the interposer 50, and forms atmospheric pressure or positive pressure in the pressure introducing hole to transfer the interposer 50 to the end-effectors 371 to 376.

Figure 6:
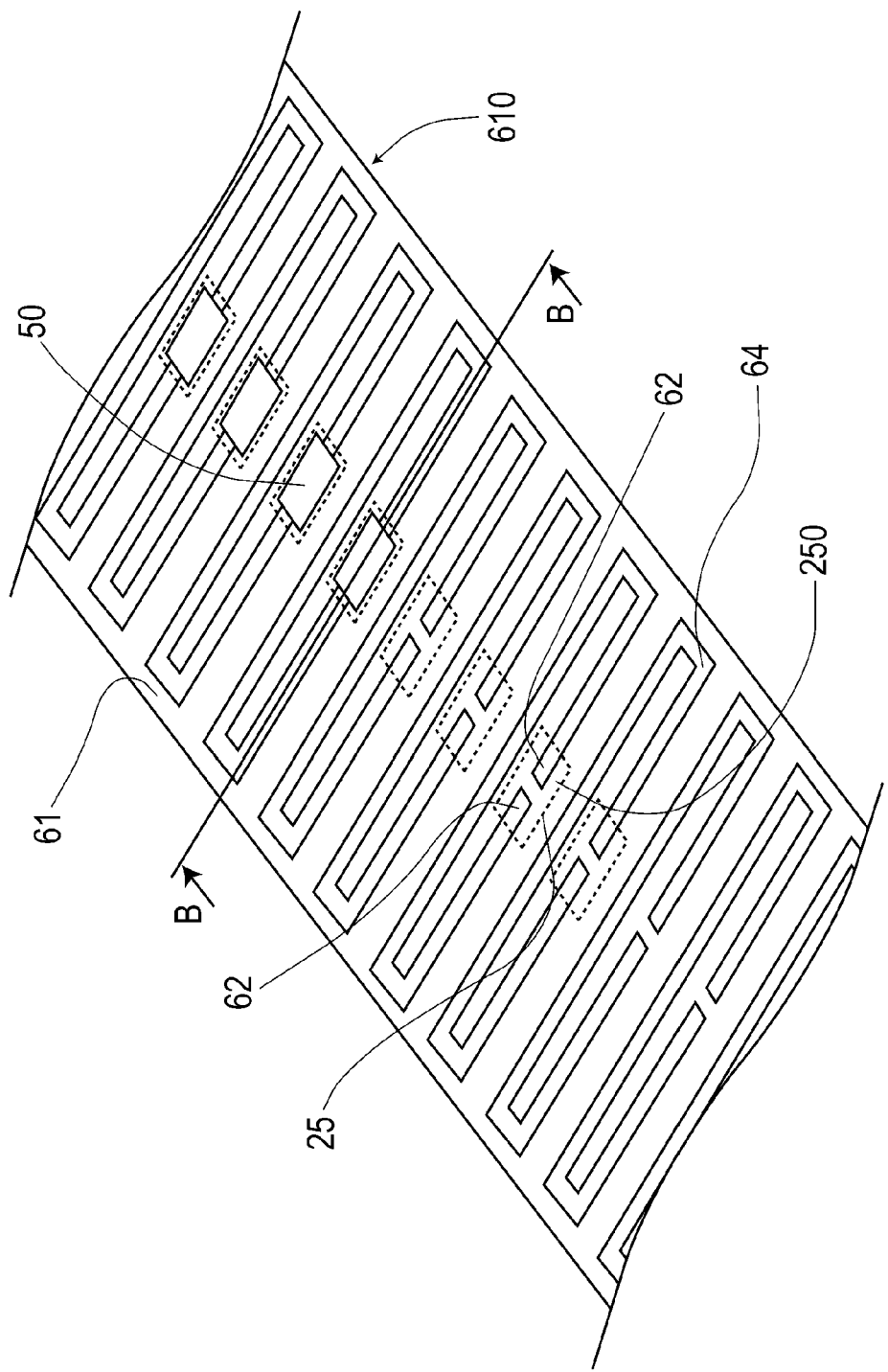
FIG. 6 is a perspective view of a continuous base member in Embodiment 1.

As shown in FIGS. 1 and 6, the converter unit 3 includes a substantially cylindrical anvil roller 35 configured to rotate while holding, on an outer peripheral surface thereof, a continuous base member 610 that is the base members 61 (see FIG. 3) in the form of continuous sheet, and to advance the continuous base member 610, and the end-effectors 371 to 376 configured to hold the interposers 50 and to revolve the interposers 50 along a circular path substantially circumscribing the outer peripheral surface of the anvil roller 35. The antenna patterns 64 are continuously formed at predetermined intervals on a surface of the continuous base member 610. The converter unit 3 is configured to successively place the interposers 50 on the surface of the continuous base member 610 so that the base terminal 62 and the interposer terminal 52 face each other.

As shown in FIGS. 7 to 11, the end-effectors 371, 373 and 375 (372, 374 and 376) in the converter unit 3 are rod members eccentrically placed substantially in parallel with a central axis CL, and supported revolvably around the central axis CL. In the embodiment, each end-effector is configured as a component of the end unit 36. The end unit 36 is constituted by a combination of an end unit 36A including the end-effectors 371, 373 and 375 and an end unit 36B including the end-effectors 372, 374 and 376. In the embodiment, the end units 36A and 36B are placed to face each other so that all the end-effectors 371 to 376 revolve along the same circumference. In the embodiment, the revolving circumference of the end-effectors 371 to 376 circumscribes the holding pulley 23 of the interposer supply unit 2 described later.

Figure 7:
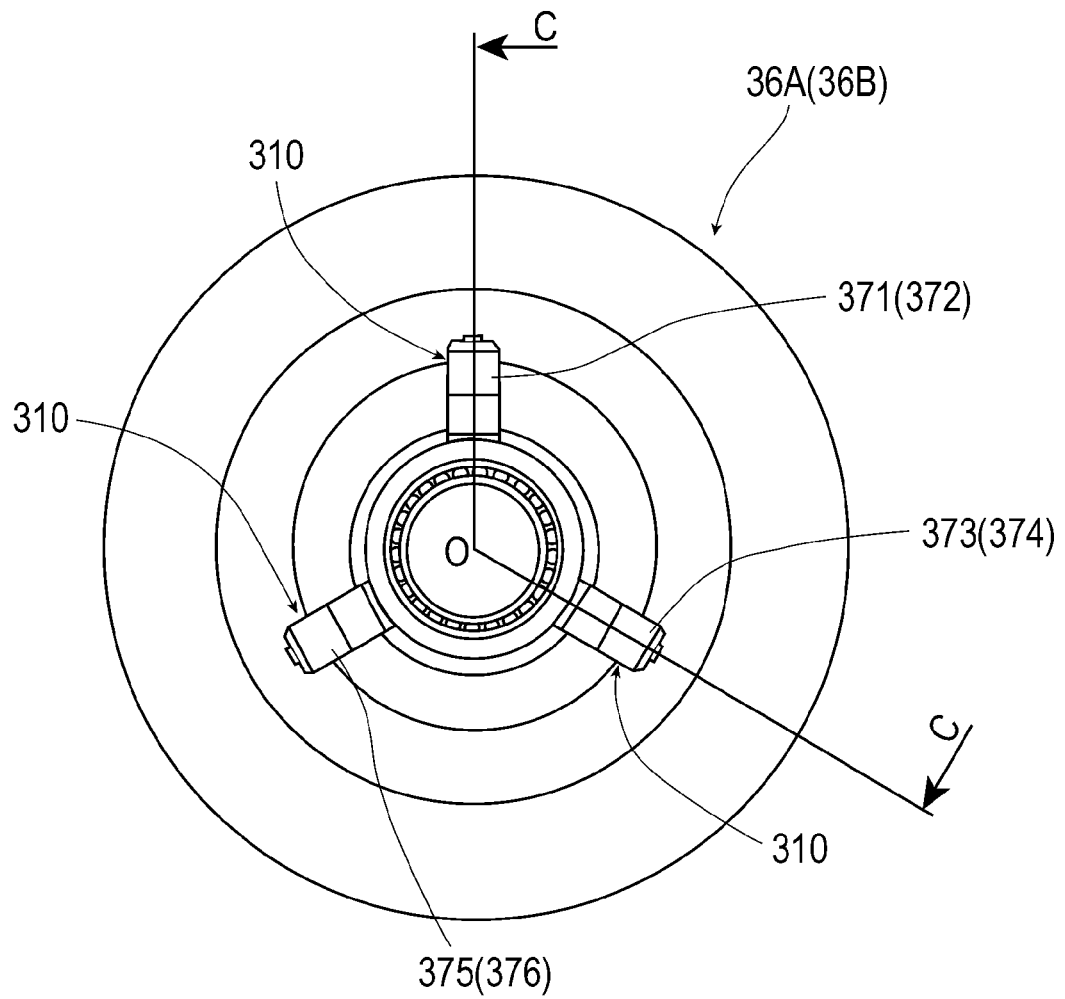
FIG. 7 is a front view of an end unit that constitutes a converter unit in Embodiment 1.
Figure 8:
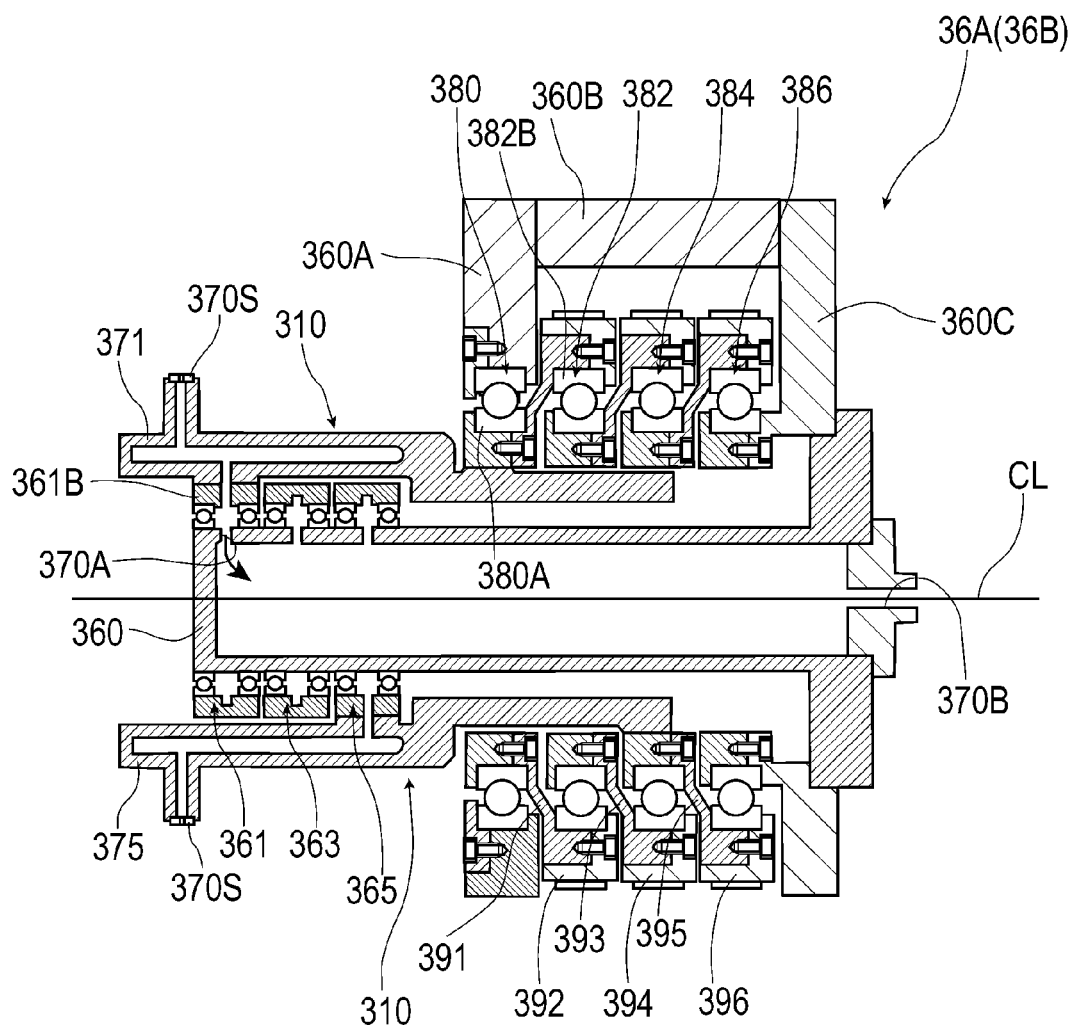
FIG. 8 is a sectional view of a sectional structure of the end unit in Embodiment 1 (a sectional view seen in the direction of arrow C-C in FIG. 7)

As shown in FIGS. 7 and 8, the end unit 36A(36B) has structure members 360A, 360B and 360C, and four coaxially placed bearings 380, 382, 384 and 386 supported by the structure members 360A, 360B and 360C and coaxially placed. A hollow shaft 360 as a structure member with the central axis CL as the axis is provided on an inner peripheral side of the bearings 380, 382, 384 and 386. On the outer periphery of the hollow shaft 360, bearings 361, 363 and 365 for supporting revolution of the end-effectors 371, 373 and 375 (372, 374 and 376) are placed correspondingly to respective end-effectors.

Figure 9:
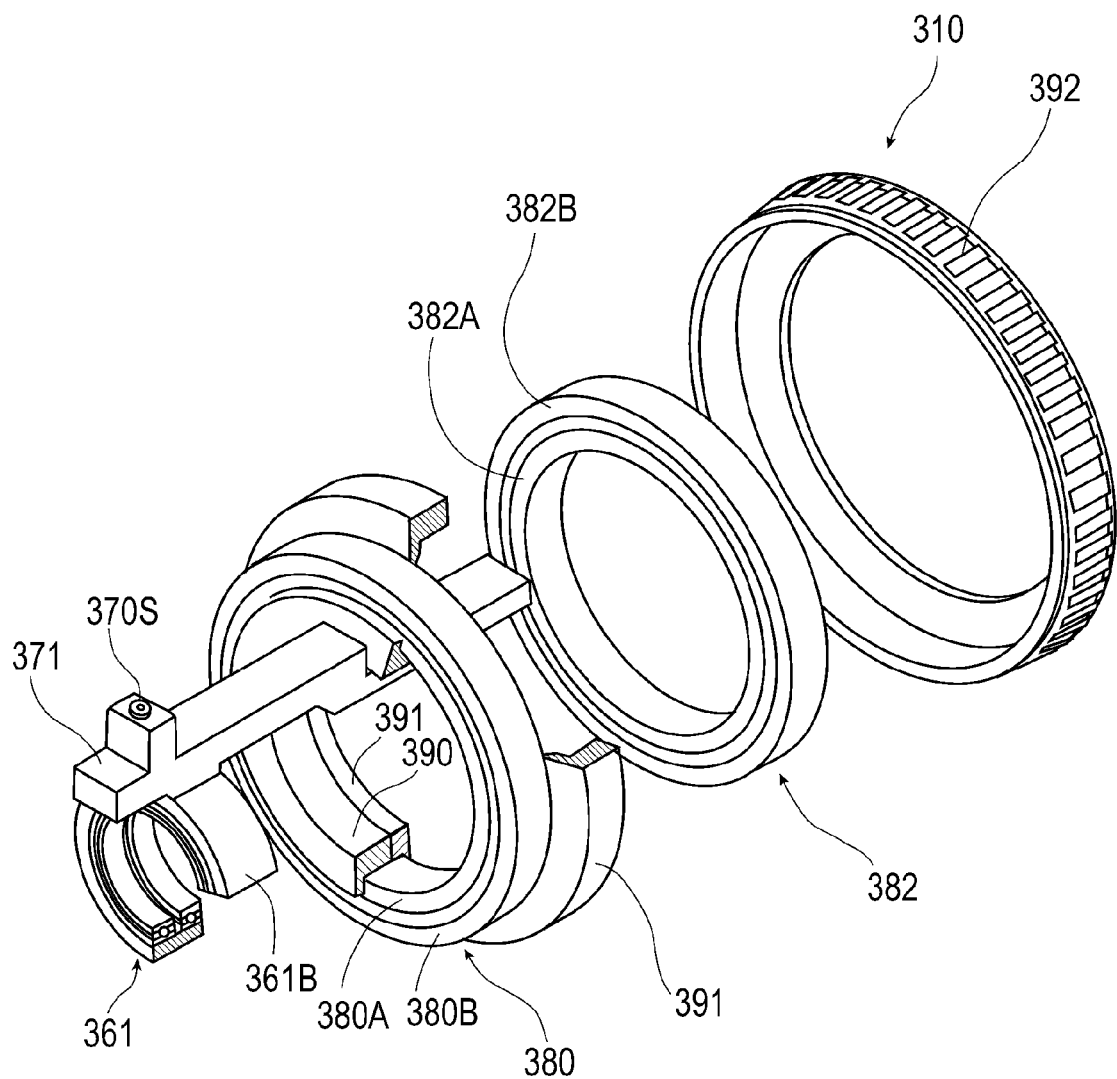
FIG. 9 is a perspective view of a configuration of the end unit in Embodiment 1.
Figure 10A:
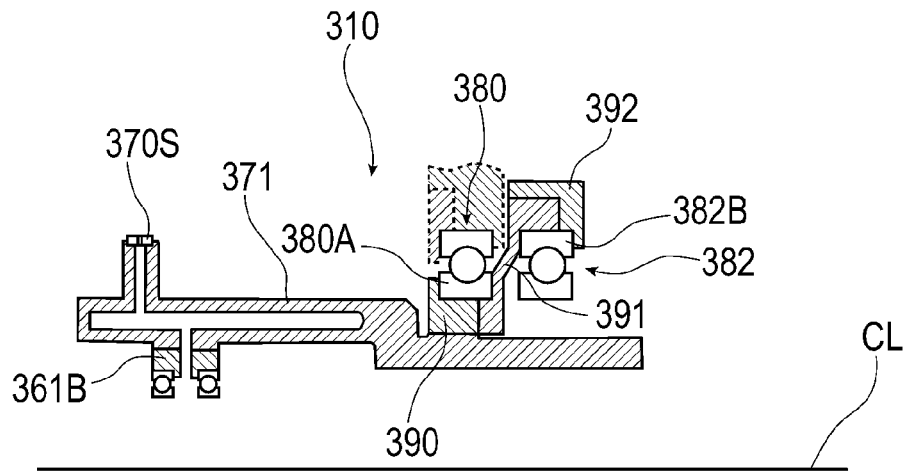
FIG. 10A is a sectional view of a sectional structure of an end-effector that constitutes the end unit in Embodiment 1.
Figure 10B:
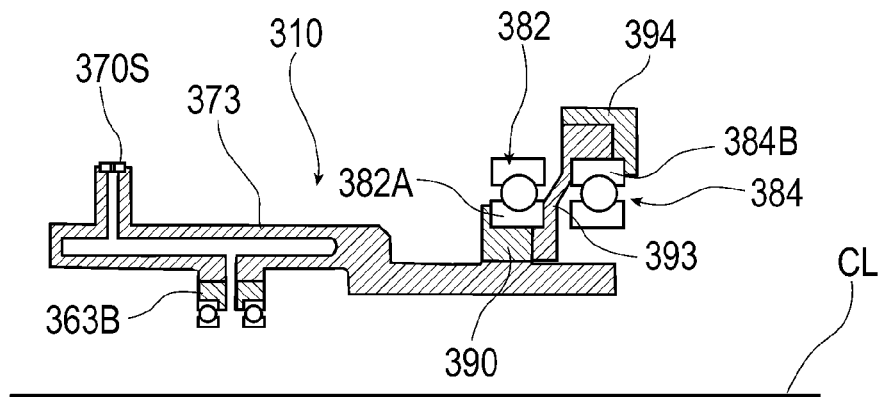
FIG. 10B is a sectional view of a sectional structure of an end-effector that constitutes the end unit in Embodiment 1.
Figure 10C:
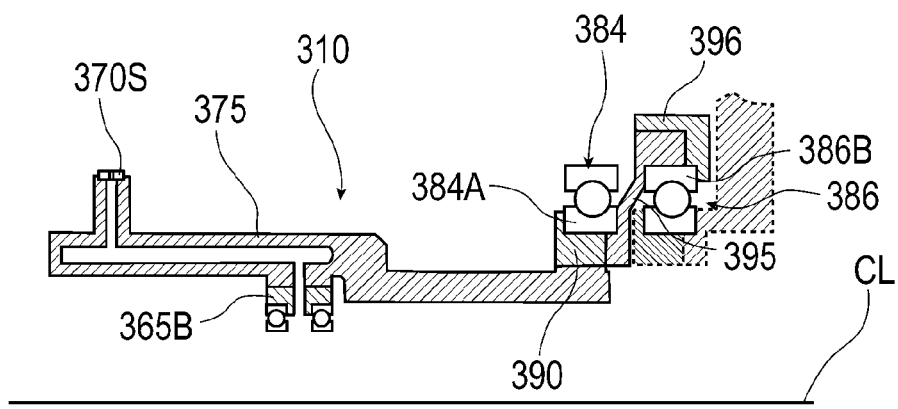
FIG. 10C is a sectional view of a sectional structure of an end-effector that constitutes the end unit in Embodiment 1.
Figure 11:
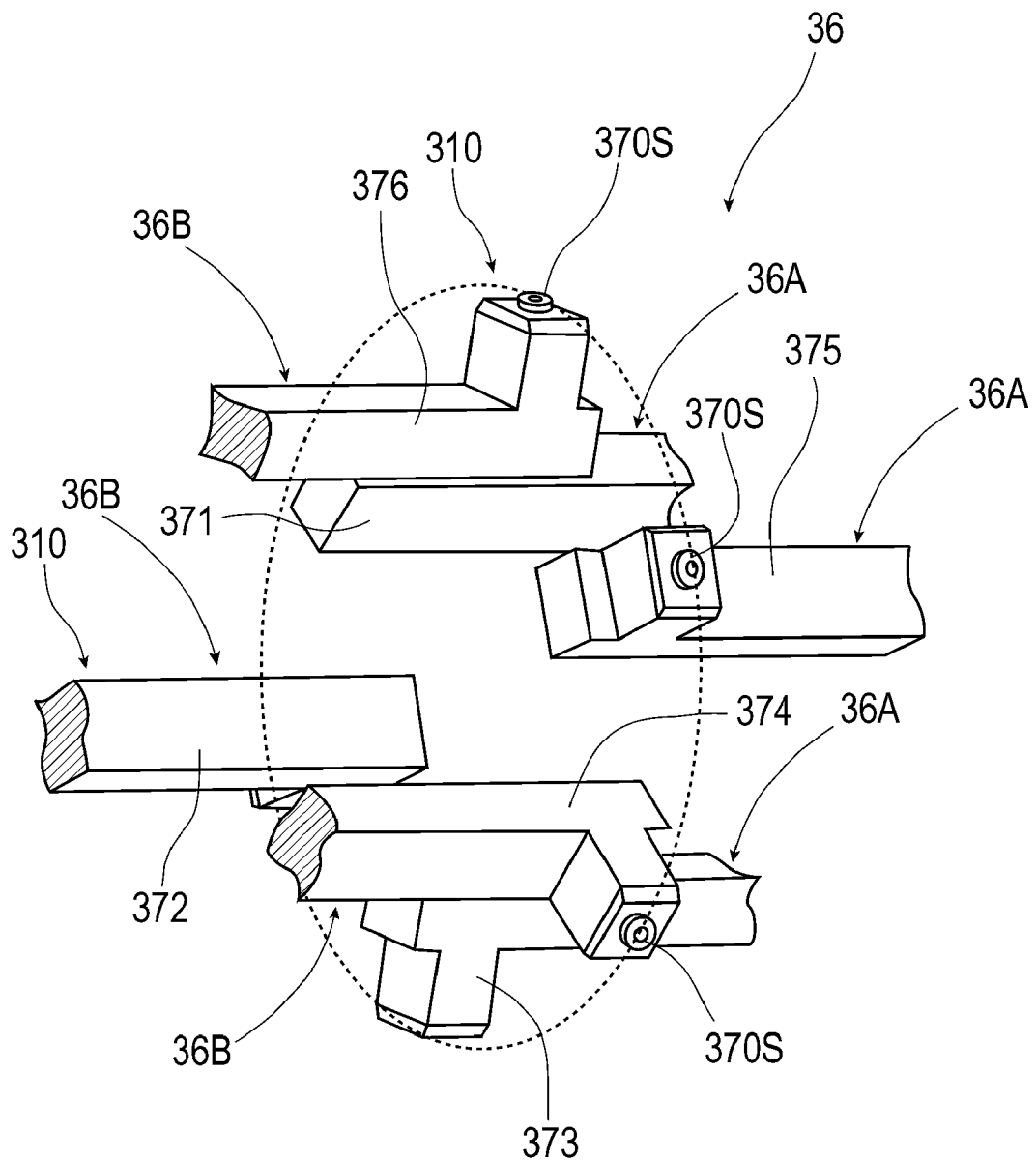
FIG. 11 illustrates the end-effectors that revolve along the same circumference in Embodiment 1.

As shown in FIGS. 9 and 10A, B and C, the end unit 36A (36B) is constituted by a combination of three coaxial rotors 310. The end unit 36A (36B) has a structure in which coaxial rotors 310 support one another. Specifically, each coaxial rotor 310 has a connecting member that connects an inner ring of one of bearings axially adjacent to each other to an outer ring of the other bearing. In each coaxial rotor, among the combinations of the inner rings and the outer rings connected via the connecting members 391, 393 and 395, the end-effectors 371, 373 and 375 are integrally secured to an inner peripheral side of the inner ring, and drive wheels 392, 394 and 396 are fitted from outside to the outer ring and secured.

As shown in FIGS. 7 to 9, each coaxial rotor 310 has one end-effector. For example, the end-effector 371 is secured on the tip side thereof (on the side of a holding surface 370S) to an outer periphery of an outer ring 361B of the bearing 361, and on the rear end side thereof to an inner periphery of an inner ring 380A of the bearing 380. The inner ring 380A of the bearing 380 is integrally connected to an outer ring 382B of the axially adjacent bearing 382 via a connecting member 391. The drive wheel 392 is secured to the outer periphery of the outer ring 382B via a part of the connecting member 391. In an outer peripheral surface of the drive wheel 392, for example, a conduction meshing groove (a precision gear or the like) for rotatable driving with a timing belt is provided.

In the converter unit 3 thus configured, the end-effectors 371 to 376 that revolve along the same circumference are configured to maintain the order of revolution thereof. The end-effectors 371 to 376 synchronize with a supply cycle by the interposer supply unit 2, and receive the interposers 50 at a relative speed of substantially zero. Then, the end-effectors 371 to 376 synchronize with the rotation of the anvil roller 35, and place the interposers 50 on the base circuit sheet 60 held by the anvil roller 35 at a relative speed of substantially zero.

As shown in FIG. 8, a through hole 370B is provided along the central axis in an end surface of the hollow shaft 360 of the end unit 36A (36B). An intake port of an unshown pump is connected to the through hole 370B. Thus, a hollow portion of the hollow shaft 360 is maintained under negative pressure by the action of the pump. A through hole 370A passing radially is provided in an outer peripheral wall surface of the hollow shaft 360. Further, holes passing radially and communicating with hollow portions of the end-effectors 371, 373 and 375 are provided in the bearings 361, 363 and 365 so as to communicate with the through hole 370A.

The end-effectors 371, 373 and 375 (372, 374 and 376) in the embodiment have, at a tip thereof, a holding surface 370S for sucking and holding the interposer 50 (see FIG. 3). The holding surface 370S has a hole for controlling air pressure, and sucks and holds the interposer 50 under negative pressure. On the other hand, when the interposer 50 is transferred to the continuous base member 610 held by the anvil roller 35, atmospheric pressure or positive pressure is formed in the hole in the holding surface 370S to release the interposer 50.

The converter unit 3 in the embodiment includes an unshown imaging device for photographing a conveying state of the interposer 50 under conveyance by the interposer supply unit 2 and obtaining image data. The image data is subjected to image processing to detect a conveying position and conveying speed of the interposer 50 under conveyance, and unshown control means controls revolution of the end-effectors 371 to 376 based on the detected conveying position and conveying speed.

Further, the converter unit 3 in the embodiment includes an unshown imaging device that photographs a state of the interposer 50 held by the end-effectors 371 to 376, and an unshown imaging device that photographs the continuous base member 610 held by the anvil roller 35. Based on the image data photographed by the imaging devices, for example, abnormalities of the interposer 50 such as an abnormal conveying interval, an abnormal position, or foreign matter, and conveying speed, a conveying position, or an abnormal pattern of the antenna pattern 64 on the continuous base member 610 can be detected.

Figure 12:
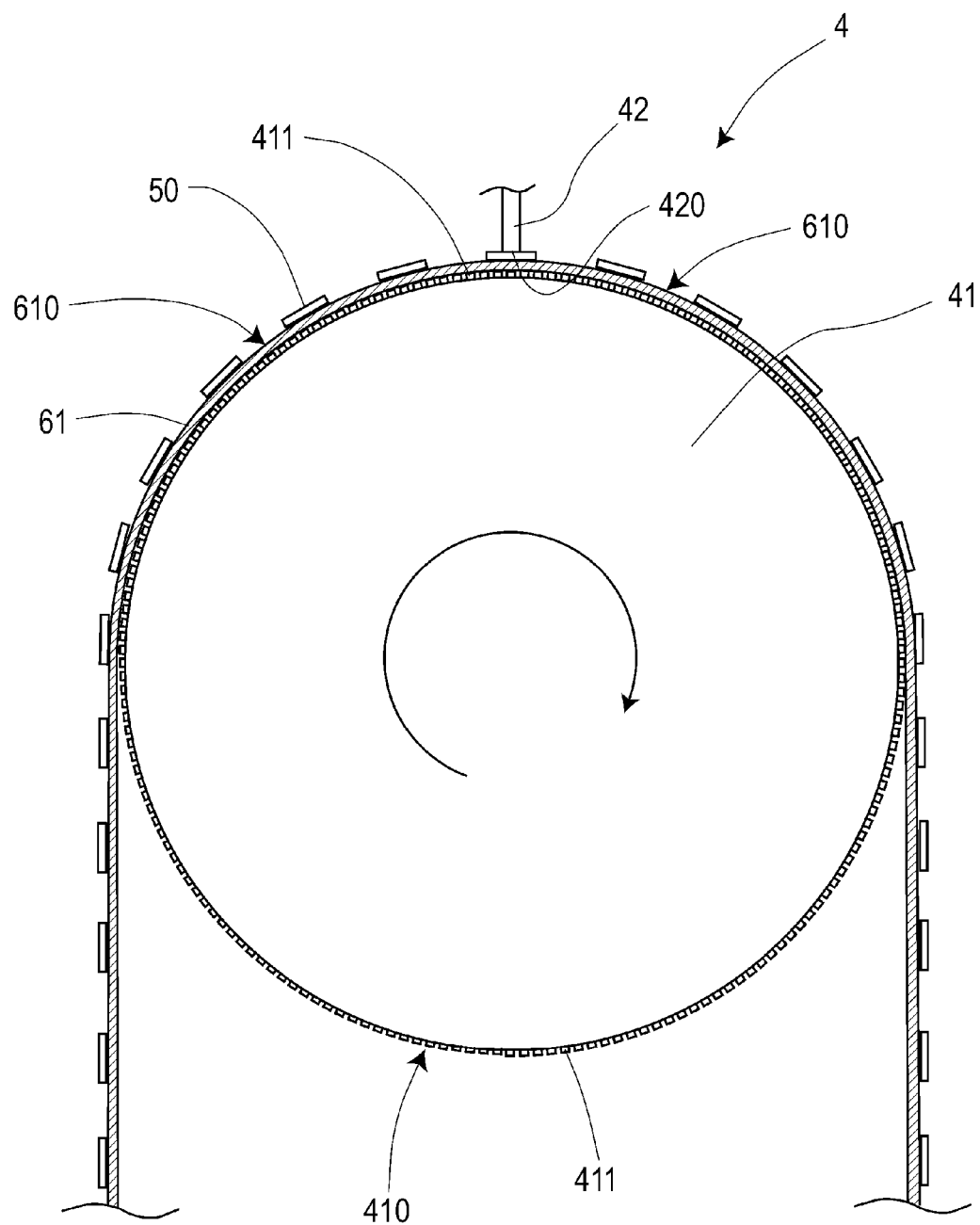
FIG. 12 illustrates a press unit machining a continuous base member in Embodiment 1.
Figure 13:
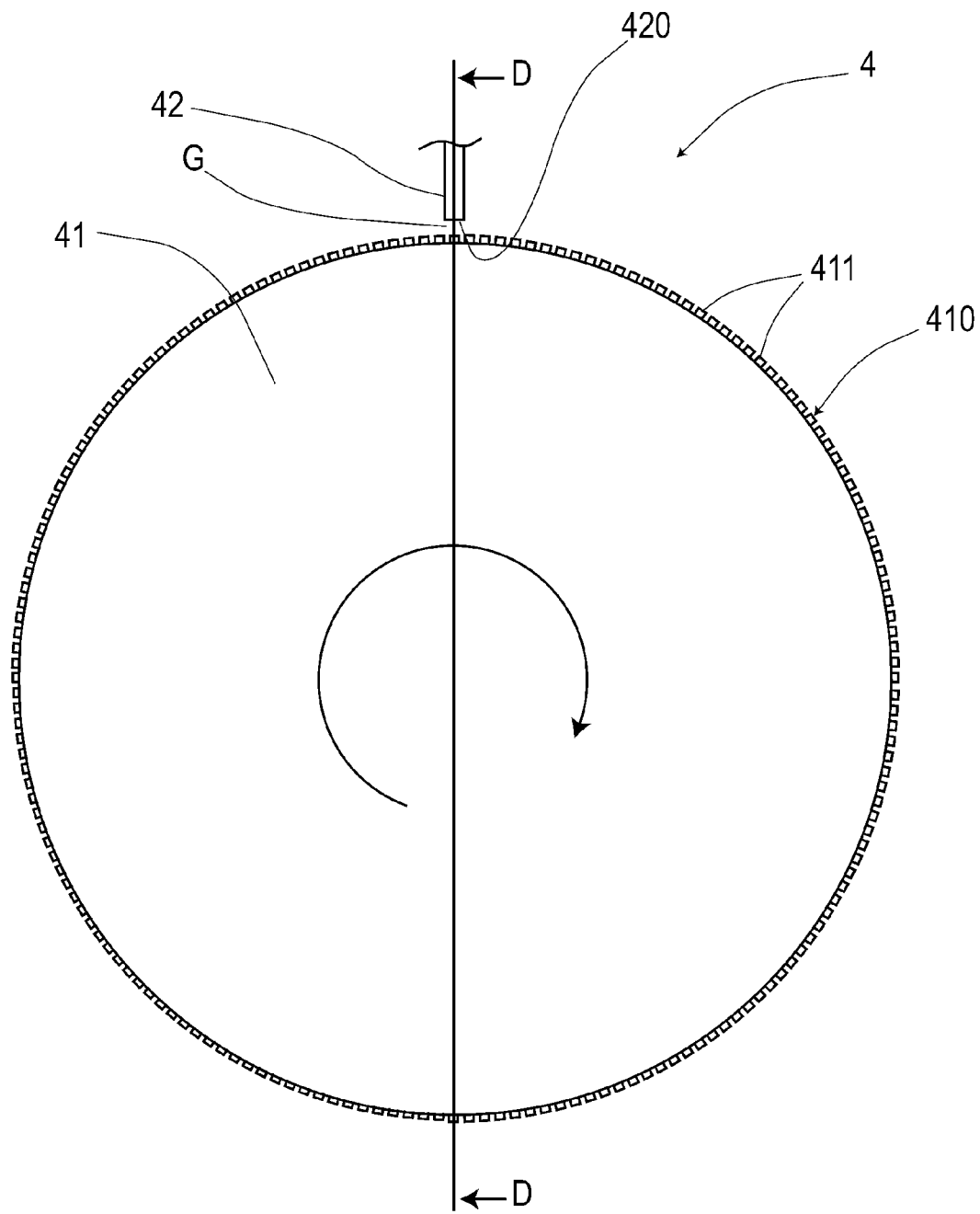
FIG. 13 is a side view of the press unit in Embodiment 1.
Figure 14:
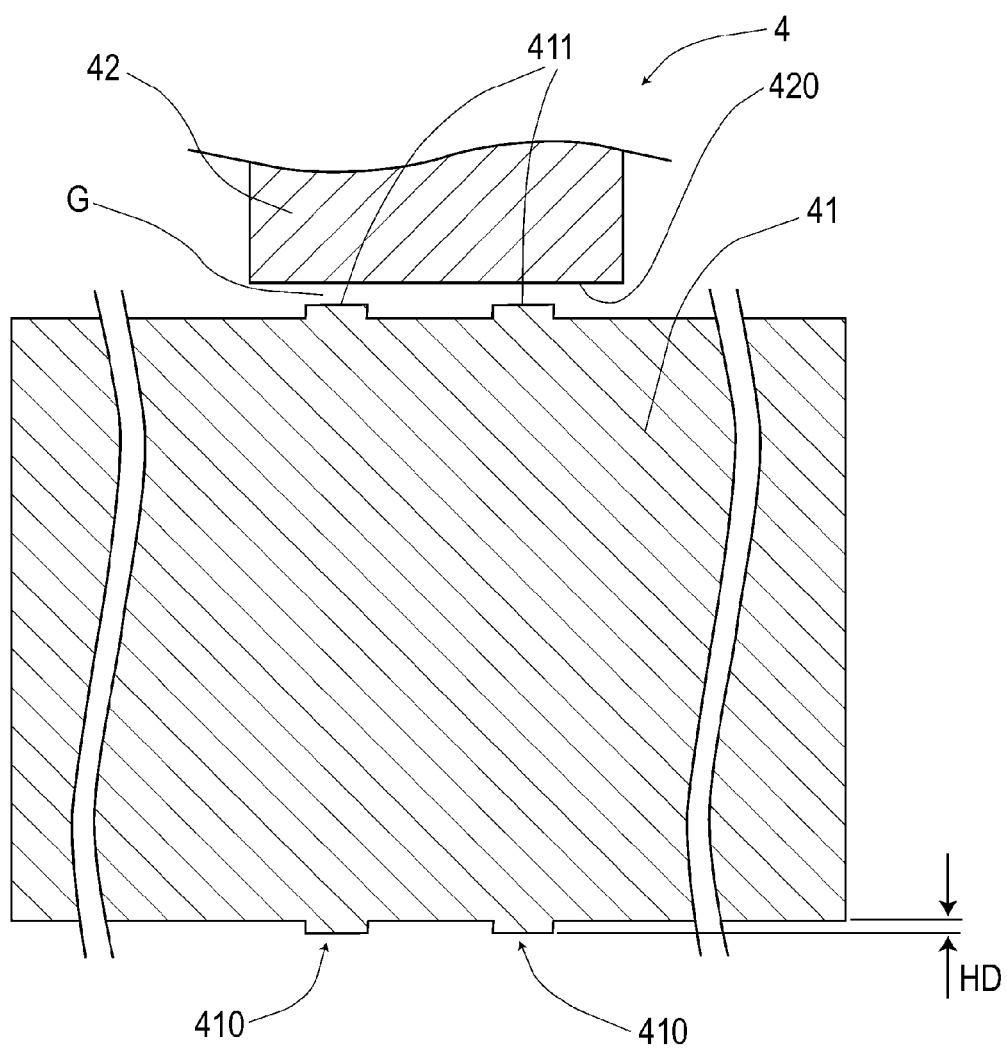
FIG. 14 is a sectional view of a sectional structure of the press unit in Embodiment 1 (a sectional view seen in the direction of arrow D-D in FIG. 13)

As shown in FIGS. 12 to 14, the press unit 4 includes a substantially cylindrical press roller 41 that rotates the continuous base member 610 after passing through the converter unit 3 while holding the continuous base member 610 on an outer peripheral surface thereof, and advances the continuous base member 610, and a bonding head 42 that faces the outer peripheral surface of the press roller 41 with a predetermined gap G. The interposers 50 are placed on the surface of the continuous base member 610. The press unit 4 is configured to press and bond the interposer 50 and the continuous base member 610 to each other in the predetermined gap G.

As shown in FIGS. 6, 12 to 14, the press roller 41 is configured to hold the continuous base member 610 so that the pair of base terminals 62 of the antenna pattern 64 are axially placed. Two rows of protrusion forming portions 410 are provided in the outer peripheral surface of the press roller 41 correspondingly to the base terminals 62. The protrusion forming portion 410 extend over the entire circumference of the press roller 41 so as to have a substantially annular shape. The protrusion forming portion 410 is provided to face each base terminal 62 of the antenna pattern 64 (see FIG. 24).

As shown in FIGS. 13 and 14, the protrusion forming portion 410 is formed by continuously providing rib-like protrusions 411 extended substantially in parallel with the axis. Each protrusion 411 protrudes from an outer periphery of the press roller 41. In the embodiment, forming pitches are set so that several protrusions 411 face each base terminal 62 (see FIG. 23). In the embodiment, a protruding height HD of the protrusion 411 is 400 μm.

Further, the press roller 41 in the embodiment has an unshown heater. As shown in FIGS. 12 to 14, the protrusions 411 heated by the heater press the continuous base member 610. Thus, the continuous base member 610 made of thermoplastic material can be deformed to protrude with ease and high accuracy in shape.

As shown in FIGS. 13 and 14, the bonding head 42 is configured to face an outermost peripheral surface formed by a protruding surface of each protrusion 411 of the press roller 41 with a gap G of 230 μm as described above. The bonding head 42 has an unshown vibration generating unit. The vibration generating unit is configured to apply ultrasonic wave vibration to a press surface 420 of the bonding head 42.

The press surface 420 is subjected to diamond coating that is surface treatment in order to prevent friction with a back surface of the interposer 50. Instead of this, surface treatment such as Teflon® coating on the press surface, or providing a carbide chip made of tungsten carbide on the press surface 420 may be also effective. Further, a roller may be provided at a tip of the bonding head 42 so that an outer peripheral surface of the roller is a press surface.

Figure 15:
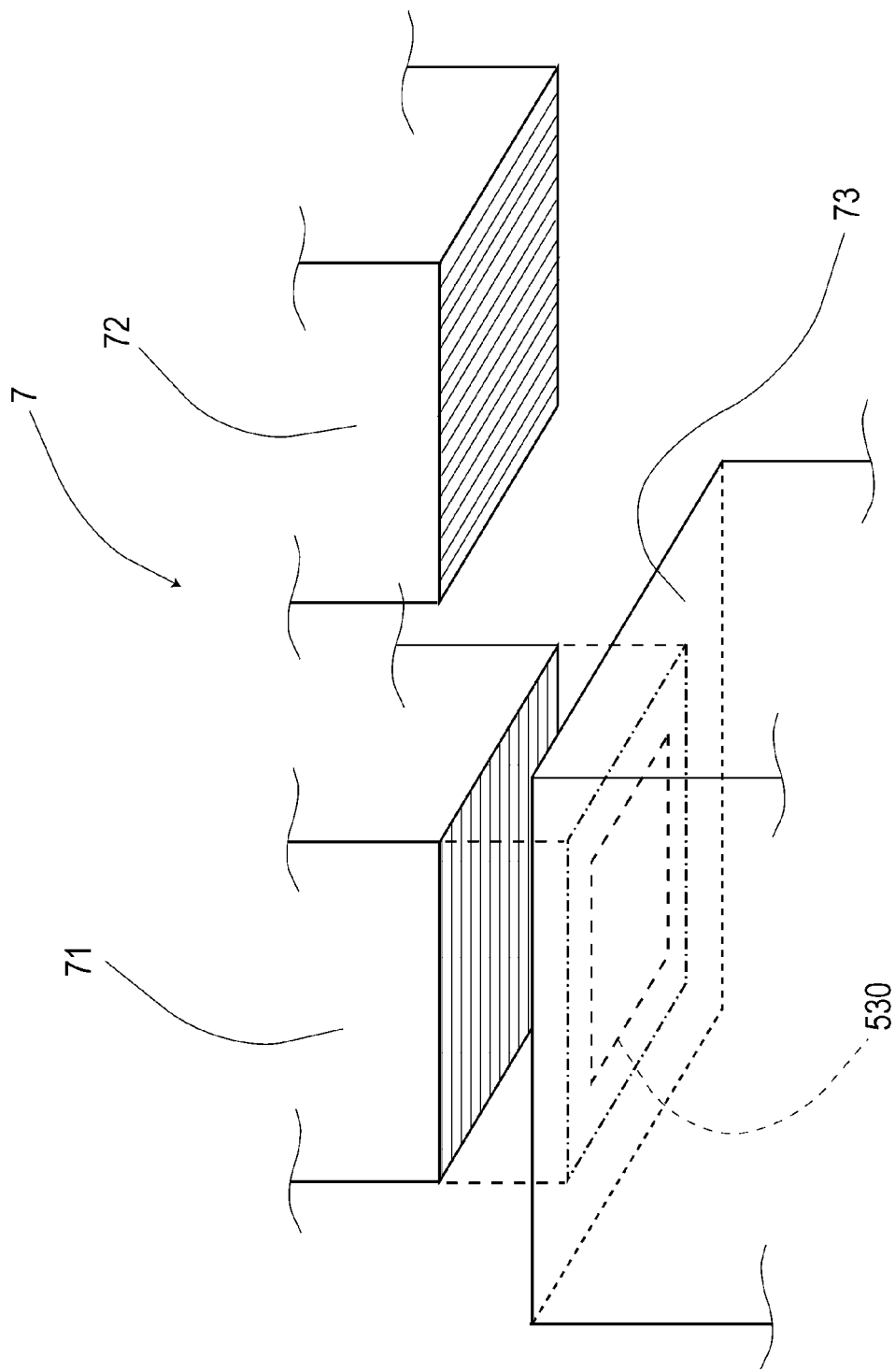
FIG. 15 is a perspective view of an interposer cutting unit in Embodiment 1.

As shown in FIG. 15, the interposer cutting unit 7 is configured to cut individual pieces of interposers 50 from the large chip holding member 530 having IC chips 51 two-dimensionally mounted on the surface in 19 rows and 43 columns. The interposer cutting unit 7 in the embodiment includes a first Thomson press 71 that cuts the large chip holding member 530 along the rows, a second Thomson press 72 that cuts the large chip holding member 530 along the columns, and a cutting mount 73. The Thomson presses 71 and 72 are hydraulic presses of Thomson type having a Thomson blade.

The interposer cutting unit 7 in the embodiment is configured to maintain the two-dimensional arrangement of the interposers 50 simply with a cut in a boundary of each interposer 50 in the large chip holding member 530. Instead of the configuration in the embodiment, a Thomson press having a grid-like Thomson blade may be used to cut the interposer 50 from the large chip holding member 530 in one pressing step.

Figure 16:
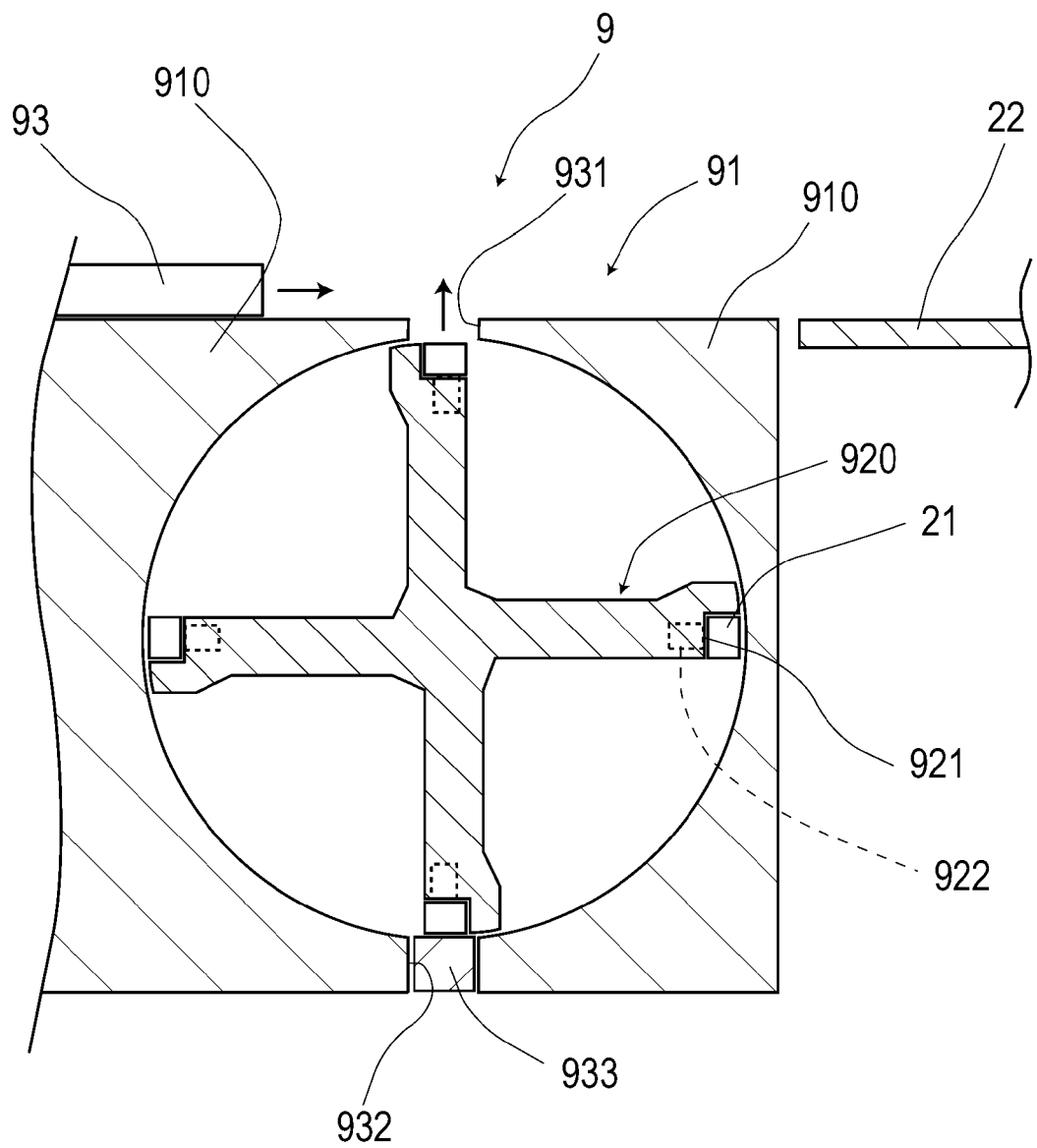
FIG. 16 is a sectional view of a sectional structure of a carrier revolver that constitutes a carrier placing unit in Embodiment 1 (a sectional view seen in the direction of arrow A-A in FIG. 2)
Figure 17:
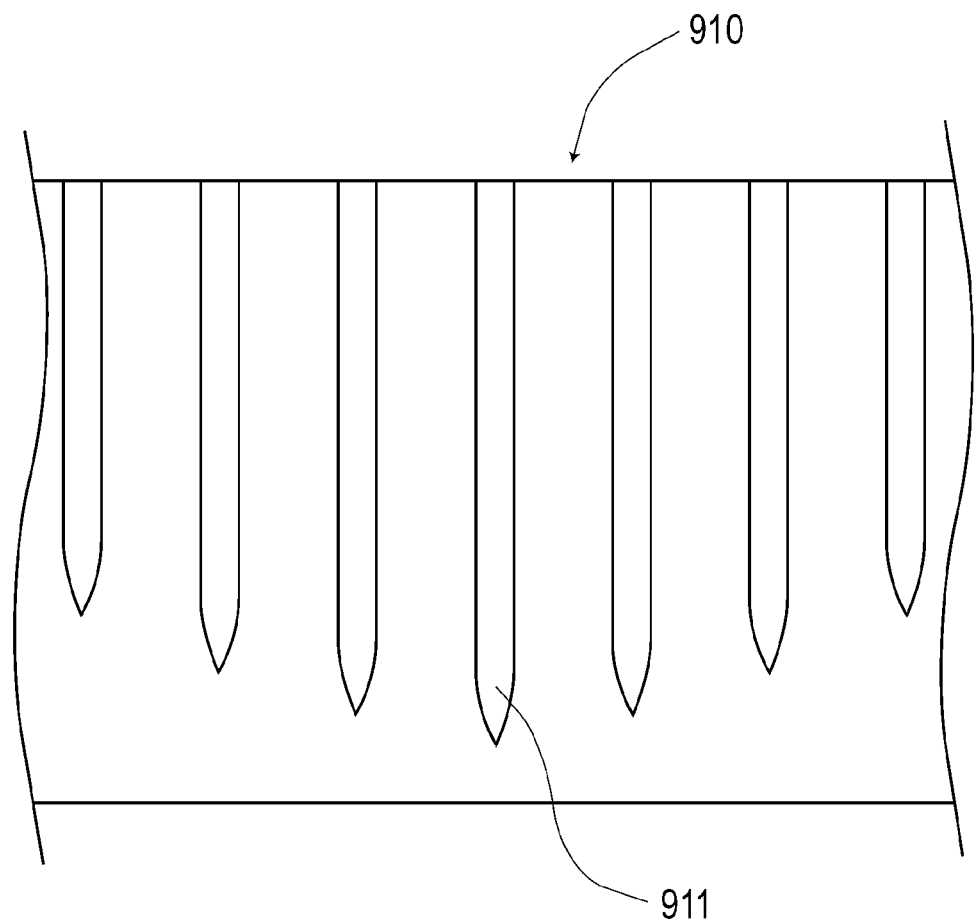
FIG. 17 is a front view of a rib provided on an inner peripheral surface of a revolver housing in Embodiment 1.
Figure 18:
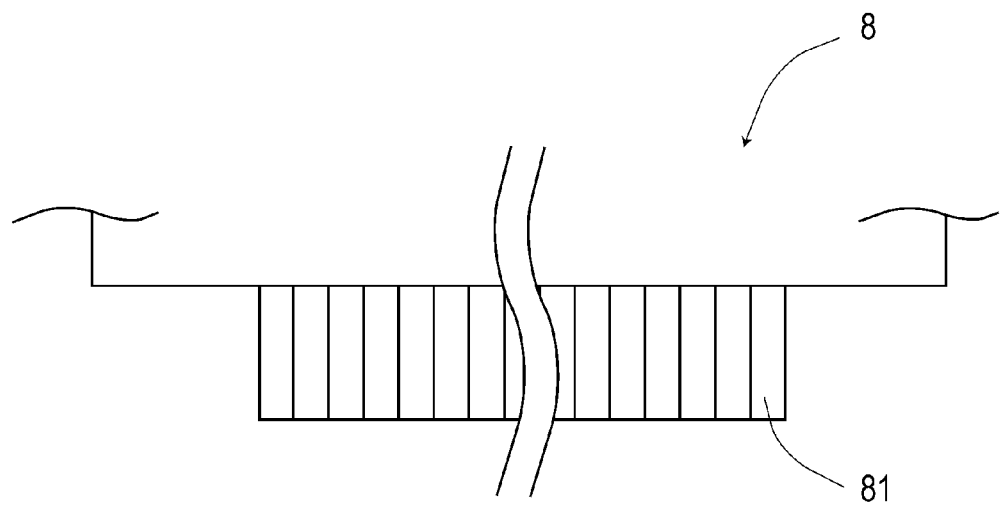
FIG. 18 is a front view of a transporter unit in Embodiment 1 (with spaces between vacuum arms reduced)

As shown in FIGS. 2, 16 and 17, the carrier placing unit 9 includes a carrier revolver 91 that sets empty carriers 21 substantially in line, a collecting conveyer mechanism 94 that receives the empty carriers 21 from the interposer supply unit 2 and supplies the carriers 21 to the carrier revolver 91, and a piano lever 93 for transferring the carriers 21 holding the interposers 50 onto the conveyer belt 22 of the interposer supply unit 2. In FIG. 1, the carrier revolver 91 is omitted.

As shown in FIGS. 16 and 17, the carrier revolver 91 is constituted by a combination of a revolver housing 910 having a substantially cylindrical space in an inner periphery thereof, and a rotary vane 920 having a substantially cross-shaped section inserted into the revolver housing 910. The rotary vane 920 is configured to rotate around an axis of the substantially cylindrical space. Four vane ends 921 protruding on an outer peripheral side of the rotary vane 920 are formed to be close to an inner peripheral surface of the revolver housing 910. The rotary vane 920 is configured to simultaneously advance the plurality of carriers 21 circumferentially along the inner peripheral surface of the revolver housing 910 with the rotation of the rotary vane 920.

A plunger 922 configured to radially move forward and backward is provided in each vane end 921. The plunger 922 is configured to lift the carriers 21 arranged along an opening groove 931, and substantially align bottom surfaces of the carriers 21 with an outer peripheral upper surface of the carrier revolver 91. This allows the piano levers 93 (see FIG. 2) to force the carriers 21 toward the conveyer belt 22.

As shown in FIGS. 16 and 17, the revolver housing 910 is constituted by a combination of a pair of right and left members each having an inner peripheral shape with a substantially semicircular section. The revolver housing 910 in the embodiment is configured to form a substantially flat surface on the outer peripheral upper surface when the pair of right and left members are combined. In the embodiment, as shown in FIG. 2, the outer peripheral upper surface of the revolver housing 910 is substantially flush with a placing surface (belt surface) of the conveyer belt 22 of the interposer supply unit 2.

As shown in FIGS. 16 and 17, the revolver housing 910 has opening grooves 931 and 932 along the axis in two positions, at circumferential upper and lower ends of the substantially circular inner peripheral section. A carrier slider 933 configured to move the carriers 21 forward and backward is provided in the opening groove 932 at the lower end. A collecting conveyer belt 941 of the collecting conveyer mechanism 94 is connected to an end of the carrier slider 933. The carrier revolver 91 in the embodiment is configured to simultaneously advance forty-three carriers 21 supplied to the carrier slider 933 by the rotary vane 920 and place the carriers in the opening groove 931 at the upper end.

As shown in FIGS. 16 and 17, the revolver housing 910 in the embodiment has ribs 911 for controlling axial positions of the carriers 21 advanced along the inner peripheral surface. In the embodiment, a number of ribs 911 are formed correspondingly to 43 carriers 21 placed at one time by the carrier revolver 91. Particularly, in the carrier revolver 91 in the embodiment, the ribs 911 on the inner peripheral surface are arranged so as to place the carriers 21 with gaps in the opening groove 931 at the upper end, the carriers 21 that are advanced from the opening groove 932 at the lower end to the opening groove 931 at the upper end being inscribed in the inner peripheral surface.

Specifically, the ribs 911 closer to the axial center have lower forming ends closer to the opening groove 932. Each rib 911 has a larger axial width with decreasing circumferential distance to the opening groove 931 at the upper end. In the carrier revolver 91 in the embodiment, the ribs 911 thus formed are inserted between the carriers 21 to gradually increase the gaps between the carriers 21 advanced from the opening groove 932 at the lower end toward the opening groove 931 at the upper end.

As shown in FIGS. 1 and 2, the collecting conveyer mechanism 94 includes the collecting conveyer belt 941 provided substantially in parallel with the conveyer belt 22 of the interposer supply unit 2, and an offset pulley 942 configured to transfer the carrier 21 conveyed by the conveyer belt 22 to the collecting conveyer belt 941. The offset pulley 942 is a substantially cylindrical rotor having a spiral groove for housing and advancing the carriers 21 on an outer peripheral surface thereof. The offset pulley 942 is configured to advance the empty carriers 21 received from the conveyer belt 22 along the spiral groove, and transfer the carriers 21 to the collecting conveyer belt 941.

As shown in FIG. 2, 43 piano levers 93 are provided correspondingly to the 43 carriers 21 arranged along the opening groove 931 in the carrier revolver 91. Each piano lever 93 is configured to move forward and backward perpendicularly to the arranging direction of the carriers 21. The carriers 21 set by the carrier revolver 91 are placed on the conveyer belt 22 of the interposer supply unit 2 by the movement of the piano levers 93. In the embodiment, the piano levers 93 constitute a part of an interposer selecting mechanism described later. The piano levers 93 are configured to selectively place carriers 21 only holding good interposers 50 on the conveyer belt 22.

Thus, as described later, empty carriers 21 to which no interposer 50 is transferred because of poor corresponding interposers 50 are not placed on the conveyer belt 22 of the interposer supply unit 2. The empty carriers 21 remain in the opening groove 931 of the carrier revolver 91, and then are again housed in the carrier revolver 91 with rotation of the rotary vane 920.

As shown in FIGS. 1 and 18 to 20, the transporter unit 8 is configured to simultaneously transfer the interposers 50 arranged substantially in line along the end side of the conveyer belt 22 among the interposers 50 cut by the interposer cutting unit 7 (FIG. 15) and still two-dimensionally arranged. Specifically, the transporter unit 8 in the embodiment includes 43 movable vacuum arms 81 configured so that negative pressure can be formed in holding surfaces that hold the interposers 50.

As shown in FIGS. 1 and 18 to 20, each vacuum arm 81 is configured to reciprocate along a movement path from a cutting position of the interposer 50 by the interposer cutting unit 7 (FIG. 15) as a starting point to a placing position of the carrier 21 set by the carrier revolver 91 as an end point. Each vacuum arm 81 is configured to move the holding surface up and down at the starting point or the end point to achieve holding of the interposer 50 or transfer of the interposer 50 to the carrier 21. The vacuum arms 81 are arranged substantially in line via an unshown expanding mechanism. Spaces between the vacuum arms 81 are reduced or increased using the expanding mechanism.

Figure 19:
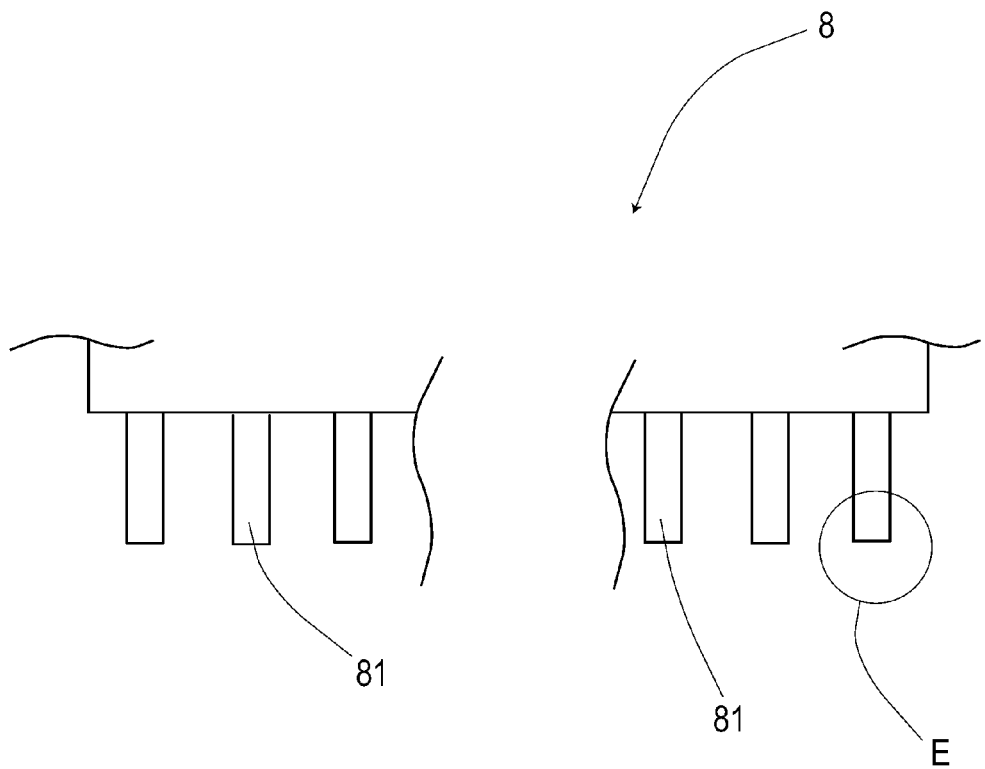
FIG. 19 is a front view of the transporter unit in Embodiment 1 (with the spaces between the vacuum arms increased)
Figure 20:
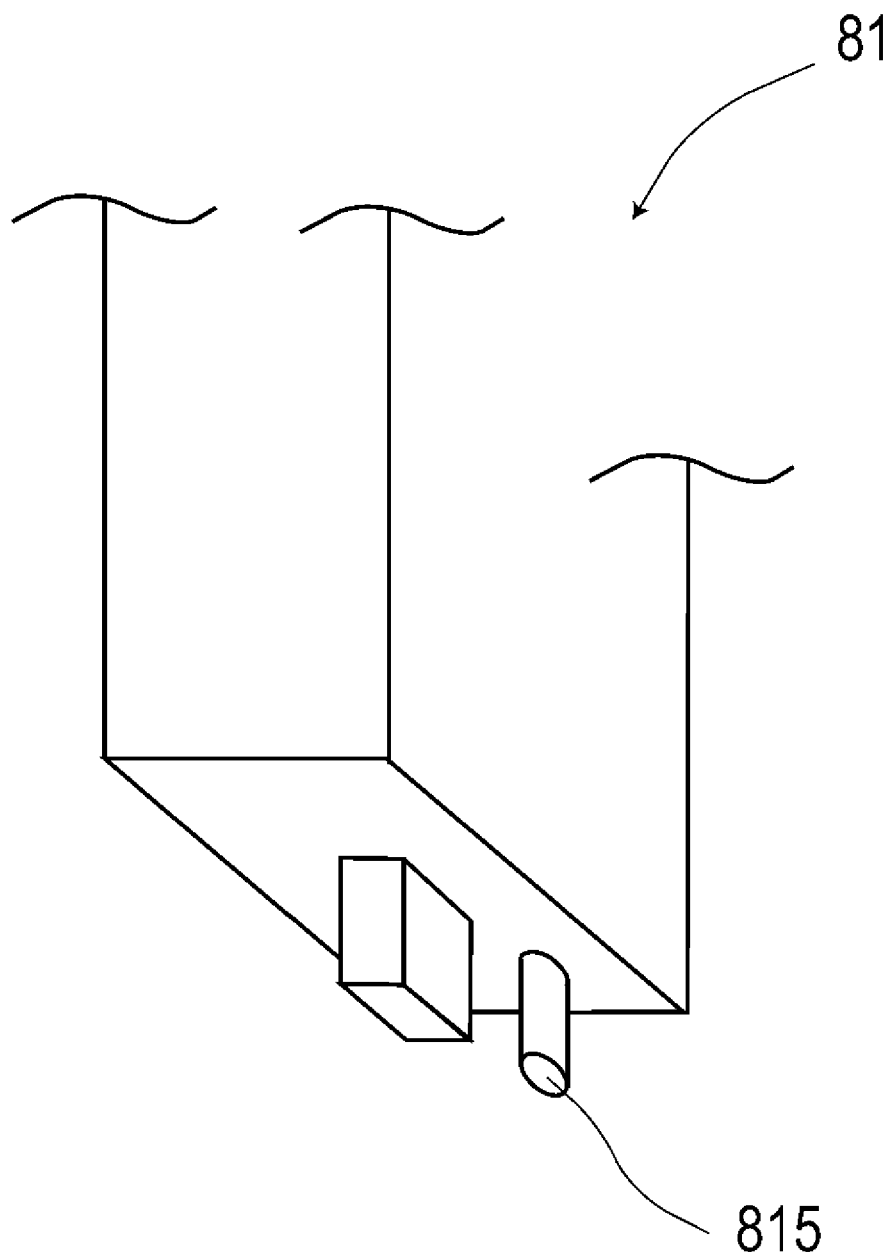
FIG. 20 is an enlarged view of a tip of the vacuum arm in Embodiment 1 (an enlarged view of a portion E in FIG. 19)

Particularly, as shown in FIG. 19, the vacuum arm 81 in the embodiment has a pin-like engaging portion 815 protruding in the direction of the normal of the holding surface or in the direction of movement of the engaging portion 815 to face the carrier 21. Then, in the embodiment, the engaging portion 815 is configured to be inserted into a circular hole 215 in the carrier 21. And the pin-like engaging portion 815 and the circular hole 215 fit each other to adjust the position of the carrier 21 relative to the vacuum arm 81 with high accuracy.

Next, the interposer selecting mechanism will be described. As shown in FIGS. 1 and 2, the interposer selecting mechanism in the embodiment includes the vacuum arm 81 of the transporter 8, the piano levers 93 of the carrier placing unit 9, a defective product detecting portion configured to previously detect interposers 50 that may be found defective in the large chip holding member 530 before cutting off the individual pieces of interposers 50, and an unshown control unit that controls the vacuum arms 81 and the piano levers 93 based on detection signals of the defective product detecting portion. For the large chip holding member 530 used in the embodiment, a defective IC chip 51 (see FIG. 3) such as with poor electrical connection has been checked and a circular mark has been printed on the defective IC chip 51.

As shown in FIGS. 1 and 2, the defective product detecting portion includes a photographing camera (not shown in figures) that photographs the large chip holding member 530 set in the interposer cutting unit 7 before cutting and obtains image data, and an image processing unit (not shown in figures) that performs image processing of the image data, detects interposers 50 that may be found defective, and outputs the detection result to the control unit. The image processing unit is configured to detect the circular mark and output the positional information of the circular mark to the control unit based on the image data.

As described above, the control unit that has captured the positional information of the circular mark from the image processing unit is configured to control the vacuum arms 81 and the piano levers 93 based on the positional information as shown in FIGS. 1 and 2. In the embodiment, when the vacuum arm 81 holds a defective interposer 50, the vacuum arm 81 ejects the interposer 50 in the movement path from the starting point to the end point. The piano levers 93 are configured to selectively force the carriers 21 only holding good interposers 50 toward the conveyer belt 22.

Next, a manufacturing procedure of the RFID medium 5 using the electronic component manufacturing apparatus 1 thus configured will be described. In the embodiment, as shown in FIG. 1, the RFID medium 5 is fabricated using the sheet-like large chip holding member 530 of resin having the IC chips 51 two-dimensionally mounted on the surface thereof, and the continuous base member 610 continuously provided with the antenna patterns 64.

In the fabrication of the RFID medium 5, the large chip holding member 530 is set in the interposer cutting unit 7, and the continuous base member 610 wound into a roll is set on an unshown roll set shaft. The continuous base member 610 has a tip leading portion without the base circuit sheet 60 at an end on the winding outer peripheral side. In setting the continuous base member 610, the tip leading portion is wound around the anvil roller 35 of the converter unit 3 and the press roller 41 of the press unit 4.

The anvil roller 35 of the converter unit 3 and the press roller 41 of the press unit are rotated in synchronization with each other to advance the continuous base member 610. An adhesive coating unit (not shown in figures) placed on an upstream side of a step of the converter unit 3 is first used to provide an adhesive providing layer 25 over the base terminals 62 of the continuous base member 610. In the embodiment, the adhesive provided layer 25 is formed of an insulating adhesive 250 having electrical insulating properties.

In the embodiment, as shown in FIG. 6, the adhesive providing layer 25 (see FIG. 21) having a thickness of 40 to 80 µm is provided in an area including an interposer placing area in the surface of the continuous base member 610. In the embodiment, as the insulating adhesive 250, thermoplastic and moisture-cured hot melt (Model No. TE-031 produced by 3M Company) is used.

On the other hand, the interposer cutting unit 7 performs the step of cutting the individual pieces of interposers 50 from the chip holding member 530. In the embodiment, the first Thomson press 71 presses the large chip holding member 530, and cuts the large chip holding member 530 along the rows of the interposers 50.

Then, the second Thomson press 72 is used to press the large chip holding member 530 cut along the rows, and cut the large chip holding member 530 along the columns of the interposers 50. In the embodiment, as described above, the individual pieces of interposers 50 are cut from the large chip holding member 530 by two pressing steps with the first Thomson press 71 and the second Thomson press 72.

On the large chip holding member 530 in the embodiment, the circular mark indicating a defective interposer is printed on an interposer 50 that may be found defective. In the embodiment, the photographing unit that constitutes the interposer selecting mechanism recognizes the position of the circular mark on the large chip holding member 530 placed on the interposer cutting unit 7. The positional data of the circular mark detected by the photographing unit is output to the unshown control unit.

The transporter unit 8 transfers to the carriers 21 the interposers 50 arranged substantially in line along the end side of the conveyer belt 22 among the interposers 50 cut by the interposer cutting unit 7. First, the vacuum arms 81 arranged adjacent to each other substantially in line are set immediately above the interposers 50 arranged substantially in line. Then, the vacuum arms 81 move down and the holding surfaces maintained under negative pressure suck and hold the interposers 50.

The vacuum arms 81 holding the interposers 50 move immediately above the carriers 21 placed substantially in line. Simultaneously, the vacuum arms 81 use the expanding mechanism to expand spaces between adjacent vacuum arms 81. Thus, the placing spaces of the vacuum arms 81 are substantially aligned with the placing spaces of the carriers 21.

Then, the engaging portion 815 is inserted into the circular hole 215 of the carrier 21 with downward movement of the vacuum arm 81 to adjust relative positional relationship thereof with high accuracy. In the embodiment, a gap is provided between the carriers 21 arranged in the opening groove 931 in the carrier revolver 91. This prevents interference between the carriers 21 in the above described positional adjustment. This allows positional adjustment of the carriers 21 with high accuracy.

When the vacuum arm 81 further moves down, the holding surface is inserted into the recess 210 in the carrier 21. At this time, interference with the vacuum arm 81 releases the locking mechanism of the carrier 21. Then, the vacuum arm 81 forms positive pressure in the holding surface and transfers the interposer 50 to the carrier 21, and then is retracted. At this time, the locking mechanism acts with the retraction of the vacuum arm 81, thereby securing the interposer 50 in the recess 210.

The step of the carrier placing unit 9 placing the carriers 21 substantially in line will be described later in detail together with collecting operation of the used empty carriers 21.

Then, the piano levers 93 selectively place the carriers 21 holding the interposers 50 on the conveyer belt 22 of the interposer supply unit 2. In the embodiment, the control unit that has captured the positional data of defective interposers 50 with circular marks controls the piano levers 93. Among the piano levers 93, the piano levers 93 corresponding to the carriers 21 holding good interposers 50 are advanced to place the carriers 21 on the conveyer belt 22. The empty carriers 21 remain in the current positions, and are again housed in the carrier revolver 91 with the downward movement of the plunger 922 and subsequent rotation of the rotary vane 920. This will be described later in detail together with collecting operation of used empty carriers 21.

The interposer supply unit 2 first advances the carriers 21 placed on the conveyer belt 22, and supplies the carriers 21 to the interval adjusting mechanism 24 constituted by the pair of carrier feed spirals 241 and 242. In the interval adjusting mechanism 24, spaces between the carriers 21 are expanded by the above described rotation of the pair of carrier feed spirals 241 and 242. The carriers 21 ejected from the interval adjusting mechanism 24 are further advanced by the conveyer belt 22 while maintaining the conveying intervals. Thus, the conveying cycle of the interposers 50 by the conveyer belt 22 is adjusted relative to the rotation cycle of the holding pulley 23 with high accuracy.

Then, each holding rod 230 is inserted into the recess 210 in the carrier 21 by the rotation of the holding pulley 23 to release the locking mechanism of the carrier 21. At this time, negative pressure is formed in the holding surface of the holding rod 230 to suck the interposer 50 held by the carrier 21. Then, when the holding pulley 23 further rotates, the holding rod 230 sucking the interposer 50 is drawn from the recess 210. In the embodiment, the interposer 50 is transferred from the carrier 21 to the holding pulley 23 by such an operation.

The end-effectors 371 to 376 of the converter unit 3 receive the interposers 50 from the holding pulley 23 while revolving along the same circumference. The holding surfaces of the revolving end-effectors 371 to 376 abut against the interposers 50 held by the holding pulley 23, suck and hold the interposers 50. In the embodiment, the interposers 50 held by the holding pulley 23 are thus successively transferred to the end-effectors 371 to 376 of the converter unit 3.

Figure 21:
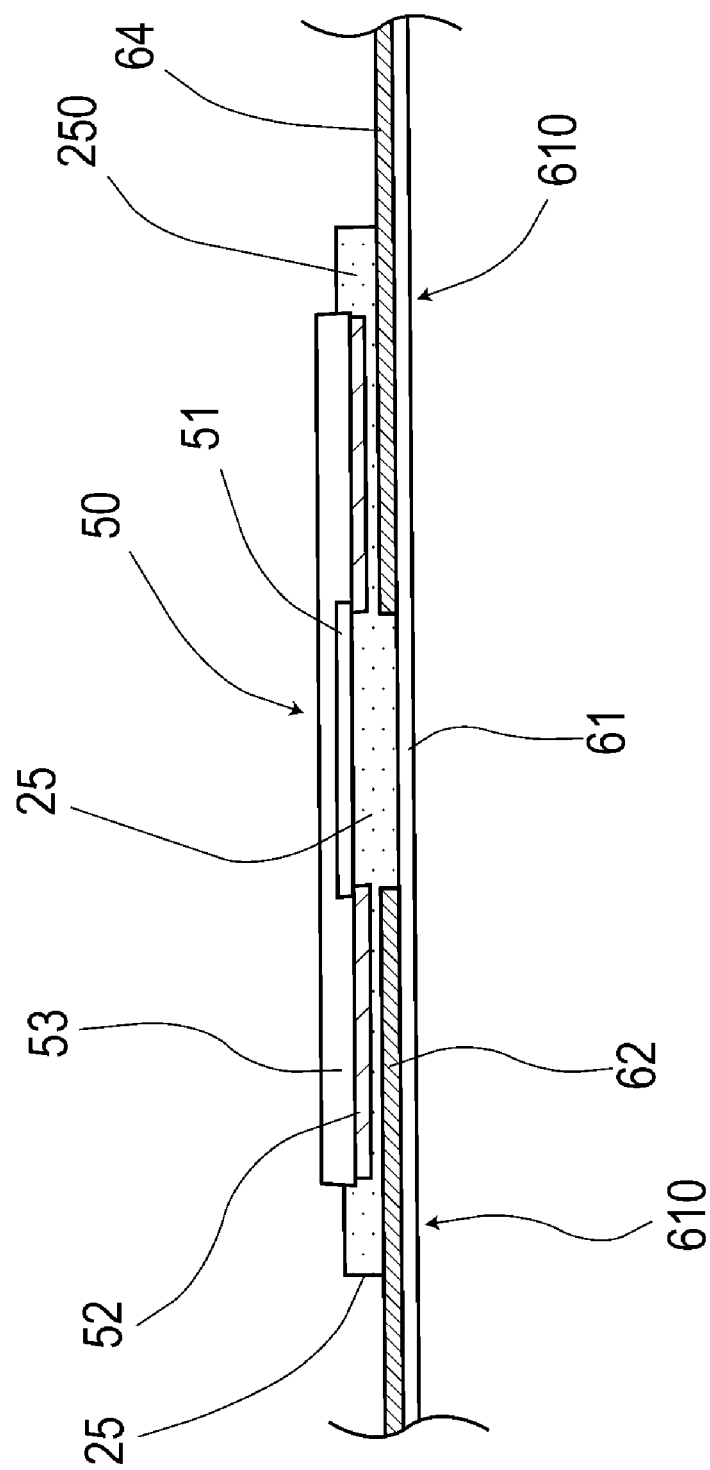
FIG. 21 is a sectional view of a sectional structure of a continuous base member on which the interposer is placed in Embodiment 1 (a sectional view seen in the direction of arrow B-B in FIG. 6)

In the converter unit 3, the individual pieces of interposers 50 are successively placed on the continuous base member 610 held by the anvil roller 35. In the embodiment, as shown in FIG. 21, the interposer 50 is placed so that the base terminal 62 of the antenna pattern 64 and the interposer terminal 52 of the interposer 50 face each other.

In the converter unit 3, the end-effectors 371 to 376 revolve along the same circumference as described above. The end-effectors 371 to 376 are independently subjected to cycle speed variation control during revolution including receipt and transfer of the interposers 50. Specifically, on a revolution path of the end-effectors, timing adjustment (revolution position adjustment) for receipt and transfer of the interposers 50 and the cycle speed variation control for adjusting revolution speed are performed.

Figure 22:
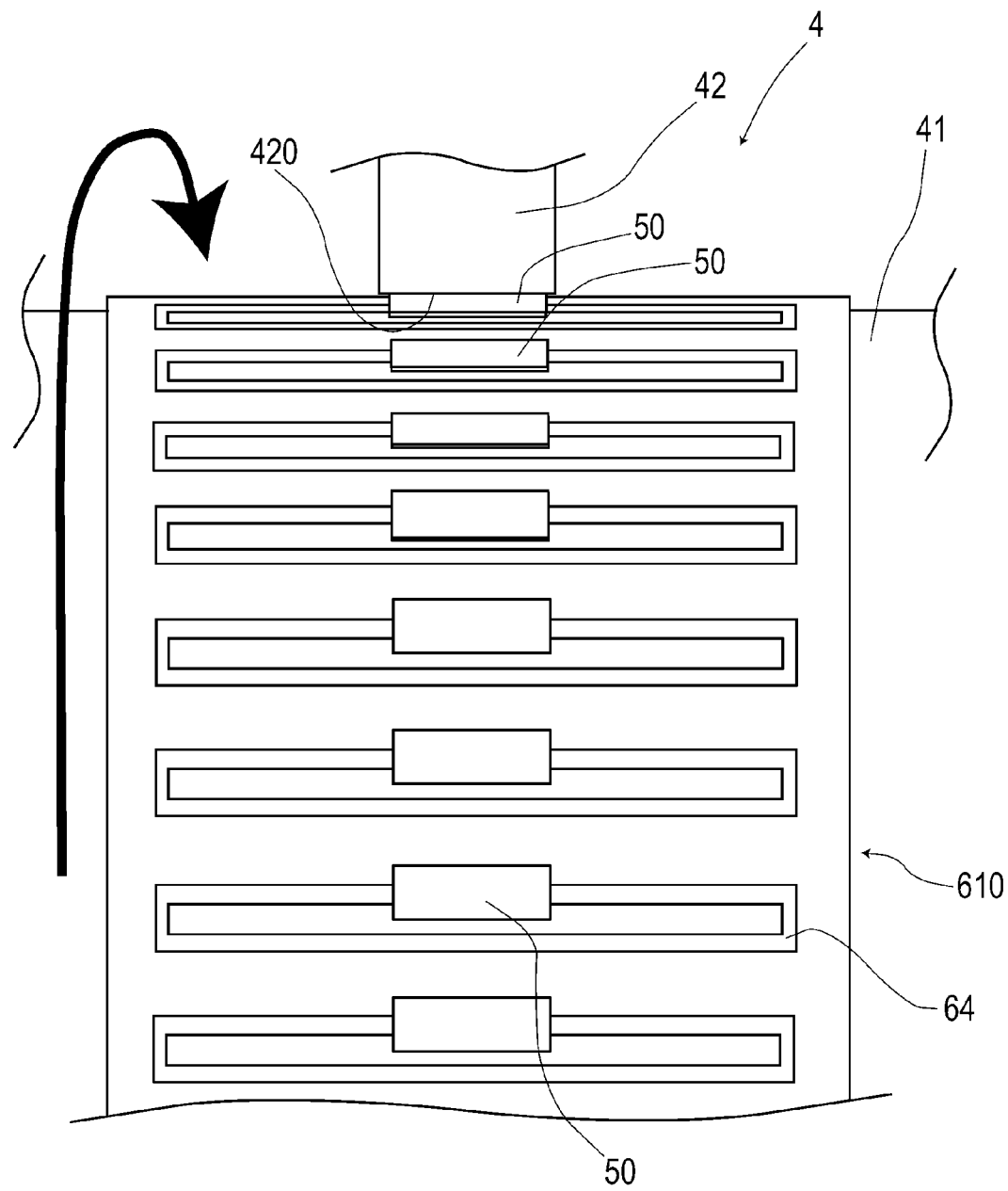
FIG. 22 illustrates the press unit machining in Embodiment 1.
Figure 23:
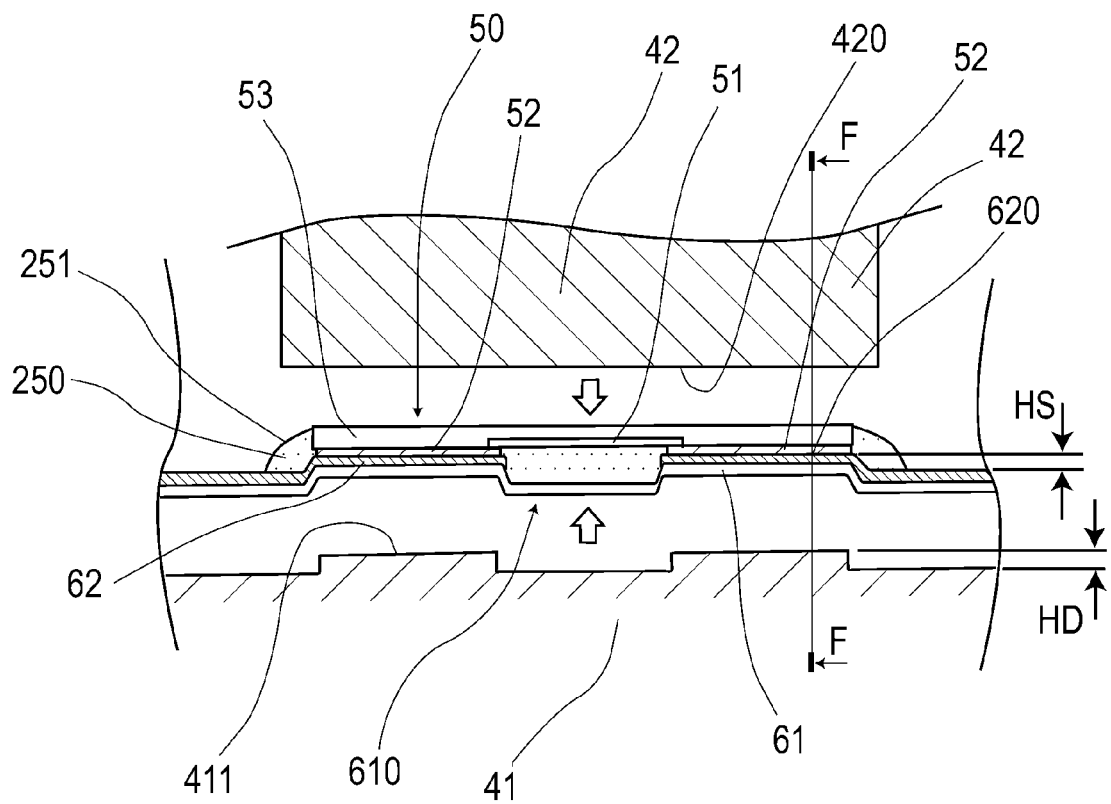
FIG. 23 is a sectional view of a sectional structure of the continuous base member machined by the press unit in Embodiment 1.
Figure 24:
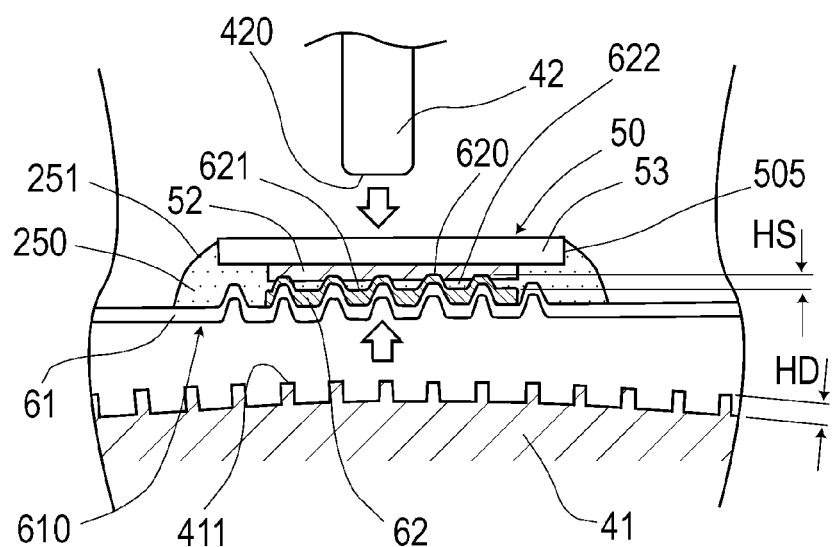
FIG. 24 is a sectional view of a sectional structure of the continuous base member machined by the press unit in Embodiment 1 (a sectional view seen in the direction of arrow F-F in FIG. 23).

Then, as shown in FIG. 22, the press unit 4 is used to press and bond the interposers 50 and the continuous base member 610. As described above, the press roller 41 of the press unit 4 has rib-like continuous protrusions 411 provided to face the back surface of each base terminal 62. As shown in FIGS. 23 and 24, the protrusion 411 having the protruding height HD of 400 μm in the embodiment can form a protruding deformation portion 620 having a protruding height HS of about 100 μm can be formed on the base terminal 62. The protruding height HD of the protrusion 411 is preferably 100 to 800 μm.

Then, in the embodiment, the press roller 41 is rotated with surface temperature of the press surface maintained at 200° C., and the interposers 50 placed on the surface of the continuous base member 610 are continuously forced toward the gap G formed by the bonding head 42. As described above, in the embodiment, the gap G between the press roller 41 and the bonding head 42 is set to 230 μm relative to the combination of the continuous base member 610 having a thickness of 100 μm and the chip holding member 53 having a thickness of 200 μm and forming the interposer 50. Thus, the continuous base member 610 and the interposer 50, which are stacked together, are passed through the gap G to allow the continuous base member 610 and the interposer 50 to be pressed. The press unit 4 in the embodiment firmly bonds the interposer 50 using a pressing force generated.

With the press unit 4 in the embodiment including the combination of the press roller 41 having the protrusion forming portion 410 and the bonding head 42, the protrusion 411 can deform and protrude a part of each base terminal 62. Specifically, as shown in FIGS. 23 and 24, the rib-like protruding deformation portion 620 can be formed in each base terminal 62 correspondingly to the rib-like protrusions 411 on the press surface of the press roller 41. Then, the base terminal 62 and the interposer terminal 52 come into direct contact with each other via the rib-like protruding deformation portion 620, and a gap 622 is formed therebetween in portions other than the protruding deformation portion 620.

Thus, as shown in FIGS. 23 and 24, the insulating adhesive 250 flows out between the protruding deformation portion 620 and the interposer terminal 52, and the protruding deformation portion 620 is press-fitted to the interposer terminal 52. This achieves electrical connection between the interposer terminal 52 and the base terminal 62 with high reliability. On the other hand, in a gap 622 between a non-protruding portion 621 except the protruding deformation portion 620 in each base terminal 62 and the interposer terminal 52 facing thereto, the insulating adhesive 250 does not completely flow out, and an appropriate amount of insulating adhesive 250 remains. This achieves adhesive bonding, that is, physical connection between the interposer terminal 52 and the base terminal 62 via the insulating adhesive 250 remaining in the gap with high reliability.

In the embodiment, the continuous base member 610 having the continuous antenna patterns 64 is used. Then, a continuous sheet-like inlet for cutting the RFID medium 5 is fabricated. Instead of this, a continuous sheet-like conveying sheet to which the base circuit sheets 60 are continuously affixed may be used to successively place the interposers 50 on the base circuit sheets 60 held by the conveying sheet.

Next, operation of the carrier placing unit 9 will be described. Here, collecting operation of the empty carriers 21 to which no interposer 50 is transferred, collecting operation of the empty carriers 21 after the transfer of the interposers 50 to the converter unit 3, and operation of again placing the carriers 21 substantially in line will be described in this order.

First, the collecting operation of the empty carriers 21 remaining in the opening groove 931 of the carrier revolver 91 will be described. Among the carriers 21 arranged along the opening groove 931 of the carrier revolver 91, the empty carriers 21 to which no interposer 50 is transferred remain in the opening groove 931 as described above. Then, the carriers advance along the inner peripheral surface of the carrier revolver 91 with downward movement of the plunger 922 followed by rotation of the rotary vane 920. The carriers 21 are housed in a carrier slider 933 placed in the opening groove 932 at the lower end.

Next, the collecting operation of the empty carriers 21 after the transfer of the interposers 50 will be described. The carriers 21 after the transfer of the interposers 50 to the holding pulley 23 are held by an offset pulley 942 and further advanced, and placed on the collecting conveyer belt 941 provided substantially in parallel with the conveyer belt 22. Each carrier 21 placed on the collecting conveyer belt 941 is housed in the carrier slider 933 placed in the opening groove 932 at the lower end by the collecting conveyer belt 941. In the embodiment, the empty carriers 21 after the transfer of the interposer 50 are thus collected in the carrier revolver 91.

Finally, the operation of again placing the carriers 21 substantially in line will be described. When the number of the carriers 21 again placed in the carrier revolver 91, and the number of the carriers 21 conveyed by the collecting conveyer belt 941 reach 43, then the rotary vane 920 starts rotating. The carriers 21 housed in the carrier slider 933 of the opening groove 932 are forced in the slider by the advance of the collecting conveyer belt 941 and arranged without gaps.

When the rotary vane 920 rotates, a substantially central portion of the column of the carriers 21 arranged without gaps first comes into contact with the rib 911. Then, the rib 911 is inserted into adjacent carriers 21 to expand the gap. When the rotary vane 920 further rotates, ribs 911 adjacent to the above described rib 911 on both sides are inserted between the adjacent carriers 21 to expand the gaps. In the embodiment, for the carriers 21 along the rotary vane 920, the gaps between the adjacent carriers are gradually expanded from the central portion toward the end. Then, the rotary vane 920 rotates to the position of the opening groove 931 at the upper end, and thus the carriers 21 arranged substantially in line with predetermined gaps are again placed along the opening groove 931.

The electronic component manufacturing method and manufacturing apparatus 1 in the embodiment are not limited to the fabrication of the RFID medium 5, but effective in fabrication of various electronic components using the interposer 50. For example, the electronic component manufacturing method and manufacturing apparatus 1 may be used in manufacturing processes of various electronic components such as an FPC (flexible printed board), a paper computer, or a disposable electrical product.

Further, the converter unit 3 used in the embodiment is not limited to the fabrication of the RFID medium 5 but may be used, for example, for transferring electronic components to an IC card component. Further, for example, a device having substantially the same configuration as the converter unit 3 in the embodiment may be used for mounting the IC chip 51 rather than the interposer 50 on the chip holding member 53. Specifically, the configuration of the converter unit 3 in the embodiment may be applied to a fabrication process of the interposer 50. Further, the converter unit 3 in the embodiment may be used as a production facility used for a manufacturing process of sanitary products such as disposable diapers or feminine hygiene products.

FIG. 1
1 ELECTRONIC COMPONENT MANUFACTURING APPARATUS
2 INTERPOSER SUPPLY UNIT
3 CONVERTER UNIT
21 CARRIER
50 INTERPOSER

The invention claimed is:

1. An electronic component manufacturing apparatus for manufacturing an electronic component in which an interposer having a semiconductor chip mounted on a sheet-like chip holding member and having an interposer terminal that is a connection terminal extended from the semiconductor chip is bonded to a base circuit sheet made of a sheet-like base member and having a base terminal on a surface, the apparatus comprising:
 a converter unit having a substantially cylindrical anvil roller configured to rotate while continuously holding the base circuit sheet on an outer peripheral surface thereof, and an end-effector holding the interposer and configured to revolve the interposer along a circular path substantially circumscribing the outer peripheral surface of the anvil roller, the converter unit being configured to place the interposer on the surface of the base circuit sheet so that the base terminal and the interposer terminal face each other;
 an interposer supply unit configured to continuously supply interposers to the converter unit,
 the interposer supply unit has carriers that hold the interposers, and a conveyer belt on which the carriers are removably attached and which conveys the attached carriers, and is configured to convey the interposers via the carriers; and
 wherein the interposer supply unit comprises an interval adjusting mechanism configured to adjust a conveying interval between adjacent carriers.

2. The electronic component manufacturing apparatus according to claim 1, wherein the apparatus comprises:
 a carrier placing unit configured to collect and place the empty carriers after the transfer of the interposer to the end-effector; and
 a transporter unit configured to transfer the interposer to each carrier placed by the carrier placing unit.

3. The electronic component manufacturing apparatus according to claim 2, wherein
 the electronic component manufacturing apparatus comprises an interposer cutting unit that cuts individual interposers so that two-dimensional arrangement of the semiconductor chips are maintained, based on the large chip holding member having the semiconductor chips mounted two-dimensionally thereon so as to form two or more rows and two or more columns, and
 the transporter unit is configured to transfer to the carriers two or more interposers arranged substantially in line along the rows or the columns among the interposers cut by the interposer cutting unit.

4. The electronic component manufacturing apparatus according to claim 3, wherein the electronic component manufacturing apparatus includes an interposer selecting mechanism that detects defective interposers, and selectively supplies good interposers to the converter unit.

5. The electronic component manufacturing apparatus according to claim 2, wherein the carrier placing unit is configured to place the carriers with gaps therebetween, and
 the transporter unit has an engaging portion configured to engage the carriers and adjust the position of the carriers, and simultaneously transfer the interposers to the carriers.

6. The electronic component manufacturing apparatus according to claim 1, wherein the semiconductor chip is an IC chip for an RFID medium, and the base circuit sheet has an antenna pattern electrically connected to the IC chip.

7. An electronic component manufacturing apparatus for manufacturing an electronic component in which an interposer having a semiconductor chip mounted on a sheet-like chip holding member and having an interposer terminal that is a connection terminal extended from the semiconductor chip is bonded to a base circuit sheet made of a sheet-like base member and having a base terminal on a surface, the apparatus comprising:
 a converter unit having a substantially cylindrical anvil roller configured to rotate while continuously holding the base circuit sheet on an outer peripheral surface thereof, and an end-effector holding the interposer and configured to revolve the interposer along a circular path substantially circumscribing the outer peripheral surface of the anvil roller, the converter unit being configured to place the interposer on the surface of the base circuit sheet so that the base terminal and the interposer terminal face each other;
 an interposer supply unit configured to continuously supply interposers to the converter unit,
 the interposer supply unit has carriers that hold the interposers, and a conveyer belt on which the carriers are removably attached and which conveys the attached carriers,
 a carrier placing unit includes a collecting conveyor mechanism that receives the empty carriers after the transfer of the interposer to the end-effector, and configured to place the empty carriers that the collecting conveyer mechanism received; and
 a transporter unit configured to transfer the interposer to each carrier placed by the carrier placing unit.

8. The electronic component manufacturing apparatus according to claim 7, wherein the carrier placing unit is configured to place the carriers with gaps therebetween, and
 the transporter unit has an engaging portion configured to engage the carriers and adjust the positions of the carriers, and simultaneously transfer the interposers to the carriers.

9. The electronic component manufacturing apparatus according to claim 7, wherein
 the electronic component manufacturing apparatus comprises an interposer cutting unit that cuts individual interposers so that two-dimensional arrangement of the semiconductor chips are maintained, based on the large chip holding member having the semiconductor chips mounted two-dimensionally thereon so as to form two or more rows and two or more columns, and the transporter unit is configured to transfer to the carriers two or more interposers arranged substantially in line along the rows or the columns among the interposers cut by the interposer cutting unit.

10. The electronic component manufacturing apparatus according to claim 9, wherein the electronic component manufacturing apparatus comprises an interposer selecting mechanism that detects defective interposers, and selectively supplies good interposers to the converter unit.

* * * * *